United States Patent
Taylor

(10) Patent No.: US 12,002,240 B2
(45) Date of Patent: Jun. 4, 2024

(54) VISION SYSTEM FOR A ROBOTIC MACHINE

(71) Applicant: FASTBRICK IP PTY LTD, High Wycombe (AU)

(72) Inventor: John Francis Taylor, Carlisle (AU)

(73) Assignee: FASTBRICK IP PTY LTD., High Wycombe (AU)

( * ) Notice: Subject to any disclaimer, the term of this patent is extended or adjusted under 35 U.S.C. 154(b) by 570 days.

(21) Appl. No.: 17/273,487

(22) PCT Filed: Sep. 4, 2019

(86) PCT No.: PCT/AU2019/000104
§ 371 (c)(1),
(2) Date: Mar. 4, 2021

(87) PCT Pub. No.: WO2020/047575
PCT Pub. Date: Mar. 12, 2020

(65) Prior Publication Data
US 2021/0192784 A1 Jun. 24, 2021

(30) Foreign Application Priority Data
Sep. 4, 2018 (AU) ................................ 2018903292

(51) Int. Cl.
*G06K 9/00* (2022.01)
*B25J 9/16* (2006.01)
(Continued)

(52) U.S. Cl.
CPC .............. *G06T 7/75* (2017.01); *B25J 9/1612* (2013.01); *B25J 9/1697* (2013.01); *B25J 11/005* (2013.01);
(Continued)

(58) Field of Classification Search
CPC ..................... G06T 7/75; G06T 1/0014; G06T 2207/10028; B25J 9/1612; B25J 9/1697; B25J 11/005; B25J 19/023; G06F 30/00
See application file for complete search history.

(56) References Cited

U.S. PATENT DOCUMENTS 8,908,913 B2 * 12/2014 Taguchi .................... G06T 7/75
382/103
8,965,571 B2 * 2/2015 Peters ...................... B25J 11/00
901/30
(Continued)

FOREIGN PATENT DOCUMENTS

| AU | 2017294796 B2 | 1/2018 |
| JP | 2017524944 A * | 8/2017 |

(Continued)

OTHER PUBLICATIONS

What are the prospects for robots in the construction industry?, Robert Bogue, Emerald, 2018, pp. 1-7 (Year: 2018).*
(Continued)

*Primary Examiner* — Jayesh A Patel
(74) *Attorney, Agent, or Firm* — Merchant & Gould P.C.

(57) ABSTRACT

The present disclosure relates to a method for determining a pose of an object in a local coordinate system of a robotic machine, the method including: capturing at least one image of a first face of the object and at least one image of at least a portion of a second face of the object; generating a point cloud representation of at least part of the object using image data obtained from the captured images of the first and second faces; fitting a first plane to the first face of the object and fitting a second plane to the second face of the object using the point cloud representation; determining a pose of the first plane and a pose of the second plane; retrieving a shape model of at least the first face of the object; locating the shape model in the local coordinate system using at least
(Continued)

in part the at least one image of the first face; and, determining the pose of the object in the local coordinate system. A vision system and robotic machine are also disclosed.

20 Claims, 12 Drawing Sheets

(51) Int. Cl.
*B25J 11/00* (2006.01)
*B25J 19/02* (2006.01)
*G06F 30/00* (2020.01)
*G06T 1/00* (2006.01)
*G06T 7/73* (2017.01)

(52) U.S. Cl.
CPC ............ *B25J 19/023* (2013.01); *G06F 30/00* (2020.01); *G06T 1/0014* (2013.01); *G06T 2207/10028* (2013.01)

(56) References Cited

U.S. PATENT DOCUMENTS

| | | | | |
|---|---|---|---|---|
| 9,868,212 | B1* | 1/2018 | Hinterstoisser | B25J 9/1671 |
| 10,500,727 | B1* | 12/2019 | Hinterstoisser | G06F 30/00 |
| 10,635,758 | B2* | 4/2020 | Pivac | B25J 9/1684 |
| 10,894,324 | B2* | 1/2021 | Watanabe | B25J 9/1697 |
| 2014/0219502 | A1* | 8/2014 | Hirota | G01S 5/163 |
| | | | | 382/103 |
| 2016/0253807 | A1* | 9/2016 | Jones | G06T 7/75 |
| | | | | 382/154 |
| 2017/0358048 | A1* | 12/2017 | Kotake | G06T 1/0007 |
| 2020/0061811 | A1* | 2/2020 | Iqbal | G06N 3/08 |
| 2020/0230821 | A1* | 7/2020 | Watanabe | G06T 19/20 |
| 2020/0387745 | A1* | 12/2020 | Ulbricht | G06T 7/33 |

FOREIGN PATENT DOCUMENTS

| | | | | |
|---|---|---|---|---|
| JP | 2017524944 | A | 8/2017 | |
| WO | 2018/009981 | A1 | 1/2018 | |
| WO | 2018/009985 | A1 | 1/2018 | |
| WO | WO-2018009981 | A1 * | 1/2018 | ............ B25J 13/089 |
| WO | WO-2018009985 | A1 * | 1/2018 | ............ B25J 13/089 |

OTHER PUBLICATIONS

Mobile Robotic Brickwork, Kathrin Dörfler et al., Springer, 2011, pp. 1-2 (Year: 2011).*
Design and Fabrication with Industrial Robot as Brick-laying tool and with Custom Script Utilization, Mirko Raković et al., RAAD, 2014, pp. 1-5 (Year: 2014).*
Methods of control for robotic brick masonry, Rami A. Rihani et al., Elsevier, 1996, pp. 281-292 (Year: 1996).*
Mobile Bin Picking with an Anthropomorphic Service Robot, Matthias Nieuwenhuisen et al., IEEE, 2013, pp. 2327-2334 (Year: 2013).*
CU-Brick Cable-Driven Robot for Automated Construction of Complex Brick Structures: From Simulation to Hardware Realisation, Yulong Wu et al., IEEE, May 2018, pp. 166-173 (Year: 2018).*
Extended European Search Report for EP Application No. 19856896.6 dated Apr. 29, 2022 (11 pages).
International Search Report for International Application No. PCT/AU2019/000104 dated Nov. 15, 2019 (5 pages).

* cited by examiner

VISION SYSTEM FOR A ROBOTIC MACHINE

RELATED APPLICATIONS

This application is a National Stage Application of PCT/AU2019/000104, filed 4 Sep. 2019, which claims benefit of Serial No. 2018903292, filed 4 Sep. 2018 in Australia and which applications are incorporated herein by reference. To the extent appropriate, a claim of priority is made to each of the above disclosed applications.

TECHNICAL FIELD

The present disclosure relates to robotic systems. In a particular form the present disclosure relates to a vision system for determining the location of an object held by a robotic machine.

BACKGROUND

Autonomous and semi-autonomous industrial robotic equipment is increasingly being used in outside work environments such as on construction sites, building sites, mining sites, and industrial sites. In many cases the equipment comprises autonomous moving booms and working parts which can grasp, manipulate and place objects. In some applications it is desirable to know precisely where the object is, so that it can be provided to another component in the system or to place it a precise location.

One such system is a robotic construction robot developed by the applicant in which a telescoping articulated arm is mounted on a truck, and a conveyor transports bricks to an end effector known as the layhead, which lays the bricks. When the brick arrives at the layhead, it is clamped while adhesive is applied and then it is rotated 180 degrees and presented for pickup by a robot arm that places the brick at a desired location, preferably with sub-mm accuracy. When a brick is laid, it is assumed that the brick is held in a certain pose with respect to the robot arm. In order for the robot arm to place a brick at the desired location, it must pick up the brick in the correct location from the clamp.

One problem is that the exact location of the brick with respect to the clamp in the layhead is not accurately known. It may be translated or rotated slightly away from an ideal pickup location of the robot arm. A vision system may be used to determine the exact 6DOF location of the brick in space ((x, y, z) pointing directions at centroid location (a, b, c)). However, this is a challenging task, as there are spatial constraints at the layhead to place cameras and sensors (without affecting the required functionality) and processing must be performed quickly (e.g. less than 2 seconds) to ensure rapid bricklaying. Further this task is made more difficult due to the varied range of outdoor conditions the robot is required to operate in—this includes temperatures ranging from 0-50 C, rain, dust, wind as well as full daylight, twilight and dark night lighting conditions. This places significant demands on the vision system for determining the location of the brick to enable precise placement of the brick.

There is thus a need to develop improved vision systems for robotic construction equipment, or to at least provide a useful alternative to existing systems.

SUMMARY

According to a first aspect there is provided a method for determining a pose of an object in a local coordinate system of a robotic machine, the method including in one or more electronic processing devices:
  a) capturing, using one or more sensor apparatus, at least one image of a first face of the object and at least one image of at least a portion of a second face of the object, wherein the at least a portion of the second face includes a first edge where the first face meets the second face;
  b) generating a point cloud representation of at least part of the object using image data obtained from the captured images of the first and second faces;
  c) fitting a first plane to the first face of the object and fitting a second plane to the second face of the object using the point cloud representation;
  d) determining a pose of the first plane and a pose of the second plane using a pose of the one or more sensor apparatus in the local coordinate system;
  e) retrieving a shape model of at least the first face of the object comprising dimensions of the at least first face in a scale of the local coordinate system;
  f) locating the shape model in the local coordinate system using at least in part the at least one image of the first face; and,
  g) determining the pose of the object in the local coordinate system using dimensions of the object, the pose of the first and second plane and the location of the shape model in the local coordinate system.

In one embodiment, the method further includes providing the pose of the object to a controller to allow a robot gripper arm of the robotic machine to grip and manipulate the object.

In one embodiment, the pose of the object is indicative of a centroid of the object.

In one embodiment, the shape model is a 2D representation of the first face of the object.

In one embodiment, the shape model is a 3D representation of the object.

In one embodiment, the shape model is derived from at least one of:
  a) a computer aided design (CAD) model of the object; and,
  b) performing a scan of the object and generating the shape model from scan data in a virtual coordinate system that preserves each dimension of the object.

In one embodiment, the one or more sensor apparatus comprises a first sensor apparatus and a second sensor apparatus that capture images using one or more pairs of stereoscopic cameras or a Time of Flight (ToF) imaging sensor that generates a point cloud representation of a field of view of the respective sensor apparatus.

In one embodiment, the object is held in a fixed location by a gripping apparatus whilst the at least one image of a first face of the object and the at least one image of at least a portion of a second face of the object are captured.

In one embodiment, the at least one image of a first face of the object and the at least one image of at least a portion of a second face of the object are captured substantially simultaneously.

In one embodiment, the one or more sensor apparatus comprise a first sensor apparatus comprising one or more sensors in a first location having a first field of view to view the complete first face of the object when the object is gripped by a gripping apparatus, and a second sensor apparatus comprising one or more sensors in a second location having a second field of view to view at least a portion of the second face of the object when the object is gripped by the gripping apparatus.

In one embodiment, the first sensor apparatus comprises an array of four sensors each with a field of view that capture a portion of the first face such that the individual fields of view are combined to form the first field of view, and images from each of the array of four sensors is combined to form a first composite image of the first face, and the first plane is fitted to a point cloud representation of the first face using the first composite image.

In one embodiment, the first sensor apparatus comprises a first pair of sensors located substantially above the object and a second pair of sensors located above the object and having an angular offset to the first pair of sensors.

In one embodiment, the second sensor apparatus comprises two sensors each with a field of view that capture a portion of the second face such that the individual fields of view are combined to form the second field of view, and images from each of the two sensors is combined to form a second composite image of a portion of the second face, and the second plane is fitted to a point cloud representation of the second face using the second composite image.

In one embodiment, the second sensor apparatus is less than 250 mm from the object.

In one embodiment, the first sensor apparatus is less than 600 mm from the object.

In one embodiment, the object is a rectangular object and the second plane is a plane orthogonal to the first plane.

In one embodiment, the method further includes offsetting the first plane by half the dimensions of the object along a first axis and offsetting the second plane by half the dimensions of the object along a second axis and intersecting the offset first plane and offset second plane to obtain a line extending through the centre of the object along a third axis.

In one embodiment, locating the shape model in the local coordinate system defines the location of the object along a third axis orthogonal to both the first and second axes.

In one embodiment, a third plane is defined through the location of the object along the third axis using the dimensions of the object along the third axis, the third plane being orthogonal to the third axis.

In one embodiment, the pose of the object in the local coordinate system is determined from:
  a) an intersection between the line extending through the centre of the object along the third axis and the third plane; and,
  b) orientations of the first and second planes.

In one embodiment, the method includes:
  a) capturing images of the first face using the first sensor apparatus;
  b) generating a first point cloud representation of the first face using the captured images;
  c) fitting a first plane to the first face using the point cloud representation; and,
  d) generating a virtual camera orthogonal to the first plane using a pose of the first plane and inverse poses of the first sensor apparatus.

In one embodiment, the method includes generating a second point cloud representation of the first face by mapping first point cloud data in accordance with the virtual camera.

In one embodiment, the shape model is a 2D shape model of the first face that is located in the second point cloud representation of the first face.

In one embodiment, the method includes:
  a) transforming the captured images from the first sensor apparatus to project them onto the virtual camera's plane so as to form virtual camera images; and,
  b) combining the virtual camera images to generate a composite image.

In one embodiment, the shape model is a 2D shape model of the first face that is located in the composite image.

In one embodiment, capturing the at least one image to determining the pose of the object takes less than 2 seconds.

In one embodiment, the pose of the object is provided as an offset from a reference location corresponding to an ideal gripping location.

In one embodiment, the first sensor apparatus captures at least two images of the first face and wherein the method includes locating the shape model in the local coordinate system at least twice using the at least two images of the first face.

In one embodiment, the method includes:
  a) performing a first shape match to locate the shape model in the local coordinate system using the first image;
  b) performing a second shape match to locate the shape model in the local coordinate system using the second image;
  c) comparing the difference between the first and second shape match; and,
  d) determining whether further images need to be captured using the first sensor apparatus in accordance with results of the comparison.

In one embodiment, the difference is compared to a threshold indicative of an alignment between the shape matches.

In one embodiment, a sensor exposure is adjusted based on an expected object position such that the expected object position corresponds to an ideal brightness in the image.

In one embodiment, a 6DOF pose of the object is determined.

In one embodiment, the object is a construction element including a brick, block or tile.

According to a second aspect, there is provided a vision system configured to determine the pose in a local coordinate system of an object gripped by a robotic machine including an arm and an end effector at a distal end thereof configured to grip and manipulate the object, the vision system including:
  a) a first sensor apparatus that in use is mounted to the end effector and having a first location and a first field of view to image a first face of the object when gripped by the end effector;
  b) a second sensor apparatus that in use is mounted to the end effector and having a second location and a second field of view to image at least a portion of a second face of the object orthogonal to the first face when gripped by the end effector;
  c) at least one processor and a memory, the memory comprising instructions to cause the processor to perform the method of the first aspect.

In one embodiment, the vision system further includes lighting mounted to the end effector to illuminate the object being imaged.

In one embodiment, the first and second sensor apparatus include filters having a wavelength similar to that of the lighting.

According to a third aspect, there is provided a robotic machine including the vision system of the second aspect, the robotic machine including:
  a) a base;
  b) an articulated arm extending from the base;
  c) a robotic end effector attached to a distal end of the articulated arm and comprising a first arm, a second arm substantially parallel to the first arm, and a bridging portion to define a Y shaped receiving portion;

d) a robotic object gripper configured to receive and to grip an object within the Y shaped receiving portion, and wherein the at least one processor and the memory are located in the base, and the first sensor apparatus is mounted to the bridging portion, and the second sensor apparatus is mounted in either the first arm or the second arm such that the field of view of the second sensor apparatus is substantially orthogonal to the field of view of the first sensor apparatus.

According to a fourth aspect there is provided a computer readable medium comprising instructions for causing a processor to perform the method of the first aspect.

BRIEF DESCRIPTION OF DRAWINGS

Embodiments of the present disclosure will be discussed with reference to the accompanying drawings wherein.

In the following description, like reference characters designate like or corresponding parts throughout the figures.

DESCRIPTION OF EMBODIMENTS

Figure 1A:
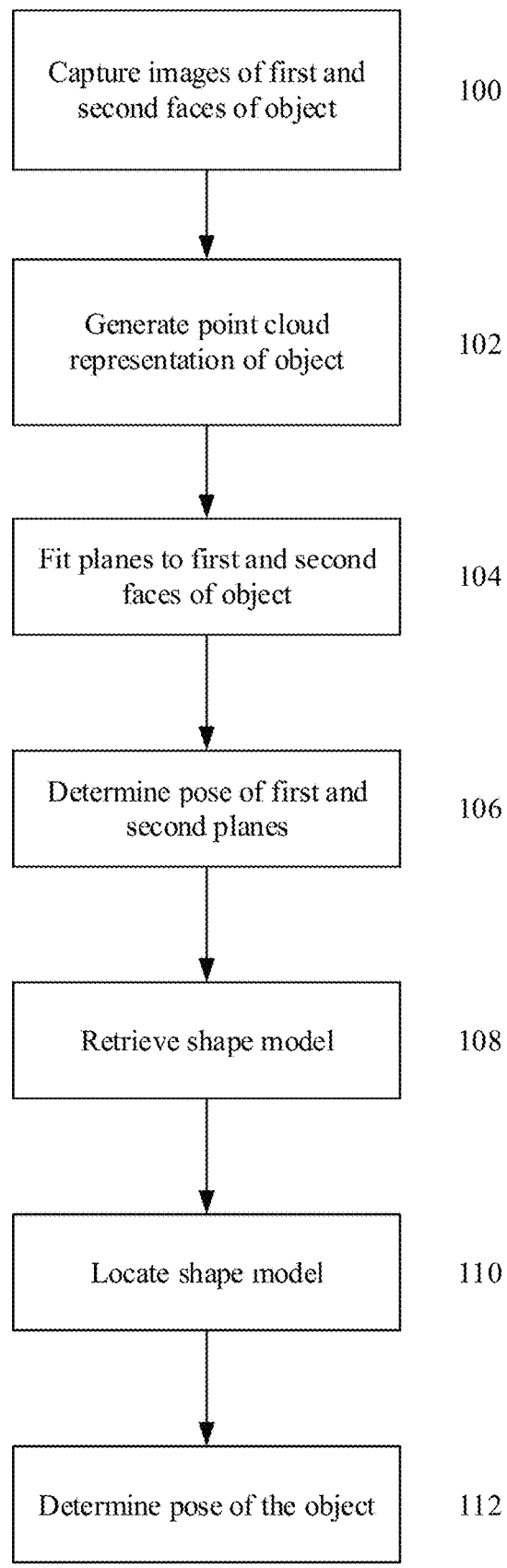
FIG. 1A is a flow chart of an example of a method for determining a pose of an object in a local coordinate system of a robotic machine.

An example of a method for determining a pose of an object in a local coordinate system of a robotic machine shall now be described with reference to FIG. 1A.

In this example, at step 100 the method includes in one or more electronic processing devices, capturing, using one or more sensor apparatus, at least one image of a first face of the object and at least one image of at least a portion of a second face of the object, wherein the at least a portion of the second face includes a first edge where the first face meets the second face. Optionally, the portion of the second face may extend orthogonally to an edge opposing the first edge so that an entire extent of the second face is imaged. In one example, the object is rectangular, and the first face is a top face of the object and the second face is an adjacent side face, however any suitable adjacent faces of the object may be imaged by the sensor apparatus. In one form, the sensor apparatus is a camera-based vision system comprising a plurality of stereoscopic cameras.

At step 102, the method includes generating a point cloud representation of at least part of the object using image data obtained from the captured images of the first and second faces. Typically, a point cloud is obtained for the entire first face and imaged portion of the second face. The point cloud may be generated using standard techniques known in the art.

At step 104, the method includes fitting a first plane to the first face of the object and fitting a second plane to the second face of the object using the point cloud representation. Any suitable best fit technique may be used to fit the planes to point cloud datapoints corresponding to each face of the object.

A pose of the first plane and a pose of the second plane is then determined at step 106 using a pose of the one or more sensor apparatus in the local coordinate system. This locates the planes in the local coordinate system and defines how the planes are orientated.

At step 108, the method includes retrieving a shape model of at least the first face of the object comprising dimensions of the at least first face in a scale of the local coordinate system. In one form, the method uses a 2D model of the first face of the object that includes its outer dimensions as well as information pertaining to any features on the first face such as cut-outs, recesses etc. A 3D model of the object could also be used and this could be derived from a CAD model or obtaining by way of a 3D scan of the actual object performed by the robotic machine.

At step 110, the method includes locating the shape model in the local coordinate system using at least in part the at least one image of the first face. In other words, a shape match is performed which seeks to align the shape model with either an image of the object or the point cloud representation of the object. If the shape model is a 2D model of the first face then the algorithm seeks to locate this model in an image of the first face or point cloud representation of the first face. Any suitable shape matching algorithm may be used, for example based on detection of edge features or the like to find a pose with best feature correlation.

Finally, at step 112, the method includes determining the pose of the object in the local coordinate system using dimensions of the object, the pose of the first and second plane and the location of the shape model in the local coordinate system. Depending on the model used for the shape match, some dimensions of the object will need to be retrieved from a database or the like which stores ideal or actual dimensions (e.g. length, width, height) of the object. As will be explained in further detail below, the dimensions are used to offset the first and second planes to obtain a line extending through the centre of the object. The exact position of the object along this line is unknown until the shape match is performed which locates the object along the line so as to define this unknown coordinate. The centroid (i.e. position) of the object in the local coordinate system can then be ascertained whilst the orientation of the object is determined from the poses of the first and second planes.

The above described method provides a number of advantages. Firstly, it enables the pose of the object to be determined by a vision system which images two faces of the object only. This is beneficial in environments whereby it is not possible to image more than two faces of the object such as where spatial limitations constrain the possible location of the sensor apparatus. By imaging only two faces of the object, the number of sensor apparatus required is minimised as well which reduces cost and robustness of the system. It has been found that the pose of the object is able to be determined to a high level of accuracy using a vision-based system.

A number of further features shall now be described.

In one example, the method further includes providing the pose of the object to a controller to allow a robot gripper arm to grip and manipulated the object. This enables the robot gripper arm to correctly pick up the object so that the pose of the object in the gripper is known thereby allowing accurate placement of the object in an environment.

Typically, the pose of the object is indicative of a centroid of the object. This allows the robotic gripper arm to pick up the object so that it is centred in the gripper and not offset.

As previously described, the shape model may be a 2D representation of the first face of the object. In one example, where the first face is a top face of the object, the 2D model is a representation of the top face including any features such as cut-outs or holes that it may have. Alternatively, the shape model may be a 3D representation of the object. The shape model may be derived from at least one of: a computer aided design (CAD) model of the object; and, performing a scan of the object and generating the shape model from scan data in a virtual coordinate system that preserves each dimension of the object. In the case of a CAD model (or other suitable user generated model) the dimensions of the model are ideal dimensions of what the object should have. For a scan model, the dimensions will be indicative of the actual dimensions of the particular object may differ from the ideal because of manufacturing tolerances and the like.

Typically, the one or more sensor apparatus comprises a first sensor apparatus and a second sensor apparatus that capture images using one or more pairs of stereoscopic cameras or a Time of Flight (ToF) imaging sensor that generates a point cloud representation of a field of view of the respective sensor apparatus. Each sensor apparatus may comprise multiple cameras sufficient to properly image the required faces and edges of the object.

Typically, the object is held in a fixed location by a gripping apparatus whilst the at least one image of a first face of the object and the at least one image of at least a portion of a second face of the object are captured. In this way, the object is kept substantially stationary whilst its pose is being determined. In one example, the at least one image of a first face of the object and the at least one image of at least a portion of a second face of the object are captured substantially simultaneously.

Typically, the one or more sensor apparatus comprise a first sensor apparatus comprising one or more sensors in a first location having a first field of view to view the complete first face of the object when the object is gripped by a gripping apparatus, and a second sensor apparatus comprising one or more sensors in a second location having a second field of view to view at least a portion of the second face of the object when the object is gripped by the gripping apparatus.

In one example, the first sensor apparatus comprises an array of four sensors (e.g. stereoscopic cameras) each with a field of view that capture a portion of the first face such that the individual fields of view are combined to form the first field of view, and images from each of the array of four sensors is combined to form a first composite image of the first face, and the first plane is fitted to a point cloud representation of the first face using the first composite image. In one configuration, the first sensor apparatus comprises a first pair of sensors located substantially above the object and a second pair of sensors located above the object and having an angular offset to the first pair of sensors. Whilst the first pair of sensors typically provide an image of the first face, the angularly offset pair of sensors assist in capturing detail along an edge of the first face.

In one example, the second sensor apparatus comprises two sensors each with a field of view that capture a portion of the second face such that the individual fields of view are combined to form the second field of view, and images from each of the two sensors is combined to form a second composite image of a portion of the second face, and the second plane is fitted to a point cloud representation of the second face using the second composite image.

As only a portion of the second face is required to be imaged, the second sensor apparatus may be located closer to the object than the first sensor apparatus which is required to image the entire first face. In this regard, the second sensor apparatus may be less than 250 mm from the object whilst the first sensor apparatus may be less than 600 mm from the object.

It is to be understood that typically the object is a rectangular object such that second plane is a plane orthogonal to the first plane.

In part of the method, a line extending through the centre of the object (e.g. in a longitudinal direction) is determined. The line corresponds to a line along which the centroid of the object is located. The line is obtained by offsetting the first plane by half the dimensions of the object along a first axis and offsetting the second plane by half the dimensions of the object along a second axis and intersecting the offset first plane and offset second plane. A line is thus obtained extending through the centre of the object along a third axis. This information can be derived from imaging two faces of the object, however the location of the centroid along the line cannot be determined from this alone. The centroid could be easily determined if a third face of the object could be imaged, however the method places a constraint on this not being possible.

The location of the centroid along the line extending through the centre of the object is obtained by fitting the place model. In this regard, locating the shape model in the local coordinate system defines the location of the object along a third axis orthogonal to both the first and second axes. Typically, a third plane is defined through the location of the object along the third axis using the dimensions of the object along the third axis, the third plane being orthogonal to the third axis.

The pose of the object in the local coordinate system is then determined from: an intersection between the line extending through the centre of the object along the third axis and the third plane; and, orientations of the first and second planes which define the orientation (pitch, yaw roll) of the object.

The shape match may be performed in a number of ways and examples of two methods shall now be described.

In one example, the method includes: capturing images of the first face using the first sensor apparatus; generating a first point cloud representation of the first face using the captured images; fitting a first plane to the first face using the point cloud representation; and, generating a virtual camera orthogonal to the first plane using a pose of the first plane and inverse poses of the first sensor apparatus. A second point cloud representation of the first face is then generated by mapping first point cloud data in accordance with the virtual camera. In other words, each point in the first point cloud is transformed so as to generate the point cloud as if derived from images taken by the virtual camera (i.e. looking straight down onto the first face of the object). It is the same point cloud but viewed from a different perspective such that the resultant point cloud resembles the proper dimension and shape of the first face of the object (in the original point cloud, the first face may be skewed and/or oblique). For a 2D shape model of the first face, the shape match is then performed by locating the shape model in the second point cloud representation of the first face.

In another example, the method includes: capturing images of the first face using the first sensor apparatus; generating a first point cloud representation of the first face using the captured images; fitting a first plane to the first face using the point cloud representation; and, generating a virtual camera orthogonal to the first plane using a pose of the first plane and inverse poses of the first sensor apparatus. The method further includes transforming the captured images from the first sensor apparatus (at least the first sensor pair located nominally above the object) to project them onto the virtual camera's plane so as to form virtual camera images; and, combining the virtual camera images to generate a composite image. For a 2D shape model of the first face, the shape match is performed by locating the shape model in the composite image of the first face. In this example, the point cloud data is only used to fit the first plane and generate the virtual camera. There is no additional processing of the point cloud which as a result reduces computational processing time. The actual images taken by the first sensor apparatus are transformed so as to project them onto the virtual camera's plane (i.e. as if the images were taken by the first sensor apparatus located directly above the first face and orthogonal thereto). The shape match is then performed by fitting the shape model to the transformed composite image.

In all examples, it is preferable that the time taken between capturing the at least one image and determining the pose of the object takes less than 2 seconds. This speed is desirable in order to allow the robotic gripper arm to expediently pick up objects and move them to a destination (e.g. lay bricks or blocks in the case of a brick laying robot).

Typically, the pose of the object is provided as an offset from a reference location corresponding to an ideal gripping location.

In one example, the first sensor apparatus captures at least two images of the first face and wherein the method includes locating the shape model in the local coordinate system at least twice using the at least two images of the first face. In this regard, the shape match is performed multiple times (at least twice) so to increase accuracy and robustness of the system.

Typically, the method includes: performing a first shape match to locate the shape model in the local coordinate system using the first image; performing a second shape match to locate the shape model in the local coordinate system using the second image; comparing the difference between the first and second shape match; and, determining whether further images need to be captured using the first sensor apparatus in accordance with results of the comparison. The difference is typically compared to a threshold indicative of an alignment between the shape matches. If the difference is below the threshold then the shape match is acceptable and the process moves on to determine the pose of the object. If the difference is above the threshold, the match is unacceptable and further images of the first face are captured for analysis.

In another example, a sensor exposure is adjusted based on an expected object position such that the expected object position corresponds to an ideal brightness in the image. This ensures that the best possible image of a respective face of the object is captured for analysis.

It is to be appreciated that typically a 6DOF pose (x, y, z position and roll, yaw, pitch) of the object is determined. The (x,y,z) position defines the centroid of the object.

The object may be any rectangular or cuboid object, and most typically is a construction element such as a brick, block or tile, however it should be appreciated that the method and system described herein is applicable to many types of robotic machines which are programmed to manipulate and move particular objects.

In another broad form, there is provided a vision system configured to determine the pose in a local coordinate system of an object gripped by a robotic machine including an arm and an end effector at a distal end thereof configured to grip and manipulate the object, the vision system including: a first sensor apparatus that in use is mounted to the end effector and having a first location and a first field of view to image a first face of the object when gripped by the end effector; a second sensor apparatus that in use is mounted to the end effector and having a second location and a second field of view to image at least a portion of a second face of the object orthogonal to the first face when gripped by the end effector; and, at least one processor and a memory, the memory comprising instructions to cause the processor to perform the method as herein described.

In one example, the vision system includes lighting mounted to the end effector to illuminate the object being imaged. This is particularly useful for allowing the machine to operate at night or in poorly lit or overcast environments. In order to minimise the effect of sunlight saturation of the vision system, filters may be applied to the sensor apparatus that have a wavelength similar to that of the lighting. The filters are designed to reduce the effect of sunlight on the captured images as they remove all light that isn't coming from the lighting mounted to the end effector.

According to another broad form, there is provided a robotic machine including the vision system as herein described, the robotic machine including: a base; an articulated arm extending from the base; a robotic end effector attached to a distal end of the articulated arm and comprising a first arm, a second arm substantially parallel to the first arm, and a bridging portion to define a Y shaped receiving portion; a robotic object gripper configured to receive and to grip an object within the Y shaped receiving portion, and wherein the at least one processor and the memory are located in the base, and the first sensor apparatus is mounted to the bridging portion, and the second sensor apparatus is mounted in either the first arm or the second arm such that the field of view of the second sensor apparatus is substantially orthogonal to the field of view of the first sensor apparatus.

Figure 1B:
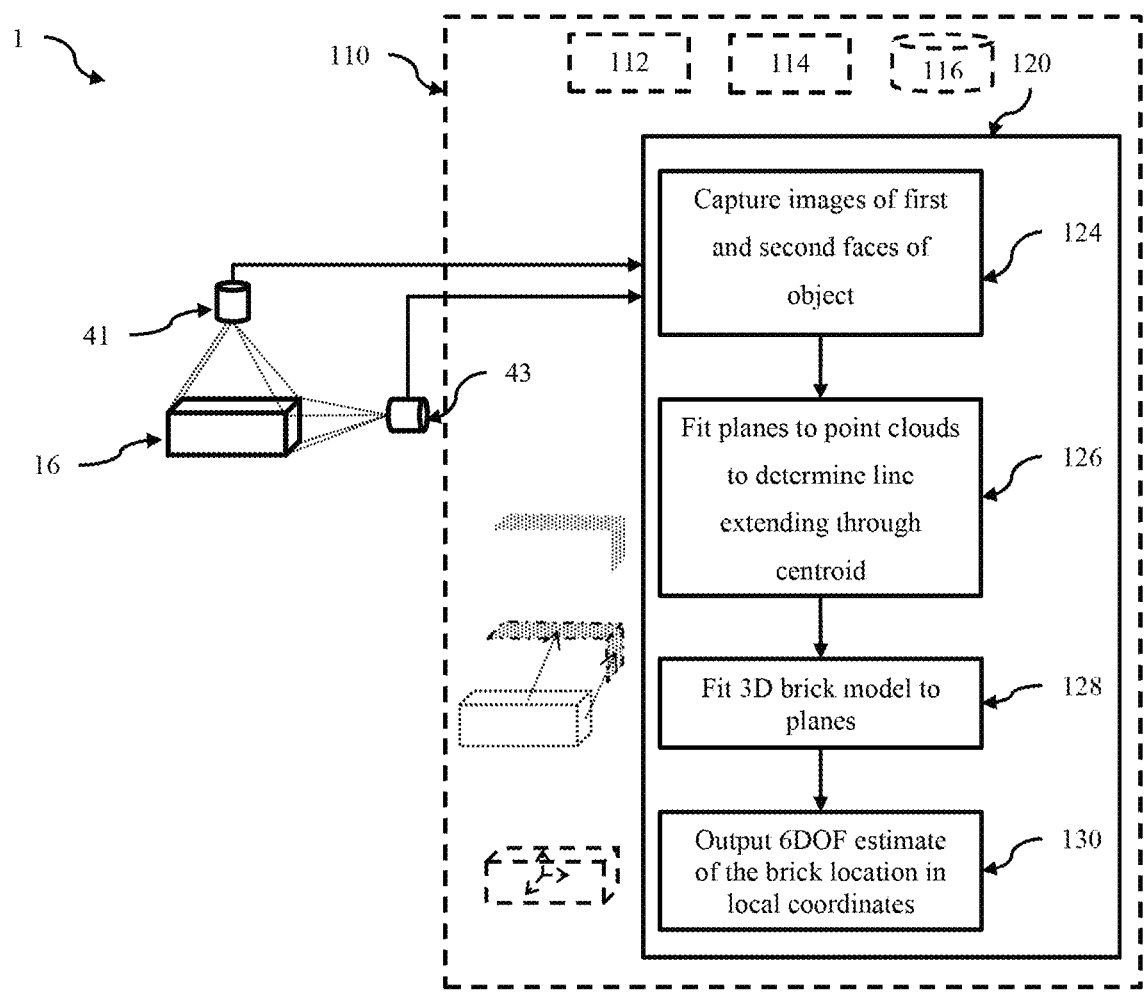
FIG. 1B is a schematic diagram of a vision system for an end effector of a robotic arm according to an embodiment.

Referring now to FIG. 1B, embodiments of a method and vision system 1 configured to determine the 6DOF location in a local coordinate system of an object gripped by a robotic machine will now be described. The robotic machine (or equipment) comprises an articulated arm extending from a base and an end effector at a distal end thereof configured to grip and optionally manipulate the object before transfer to a robotic gripper arm which may be configured to place the object in an environment. The vision system is used where it is desirable to know the precise location of the object with respect to the end effector to allow the robotic gripper arm to precisely grip and manipulate the object. To further illustrate the invention an automated bricklaying robot will be described in which a conveyor conveys a brick or block (the object) to an end effector in the form of adhesive applying and brick laying head (referred to as the layhead). When the brick arrives at the layhead, it is picked up by a 'flipper' clamp which holds the brick while adhesive is applied and then flips it 180 degrees and presents the brick for pickup by gripper of the robot arm (the layrobot). The exact position of the brick with respect to the flipper clamp is not accurately known and thus a vision system is used to determine the precise 6DOF location of the brick so that the robot arm can be controlled to pick up the brick and precisely lay it at a desired location, preferably with sub-mm accuracy. However it is to be understood that this embodiment is illustrative and in other embodiments the gripper of the robotic arm could be substituted with other attachments such as welding equipment, spray painting equipment, or handling equipment such as grippers which are arranged to hold components in an assembly operation, and the objects could be a rectangular, cylindrical or regular polygonal shaped object.

Figure 2A:
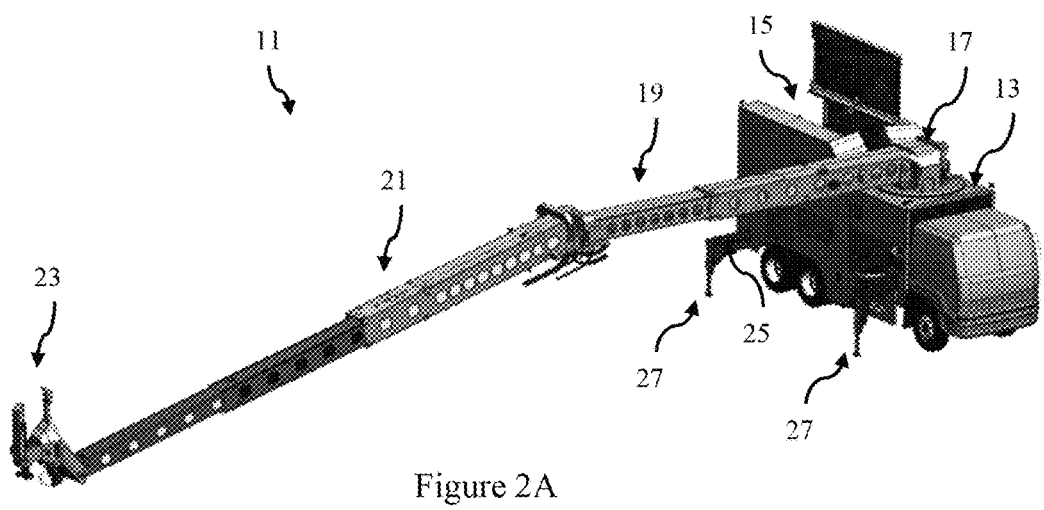
FIG. 2A is a perspective view of a bricklaying robot according to an embodiment.
Figure 2B:
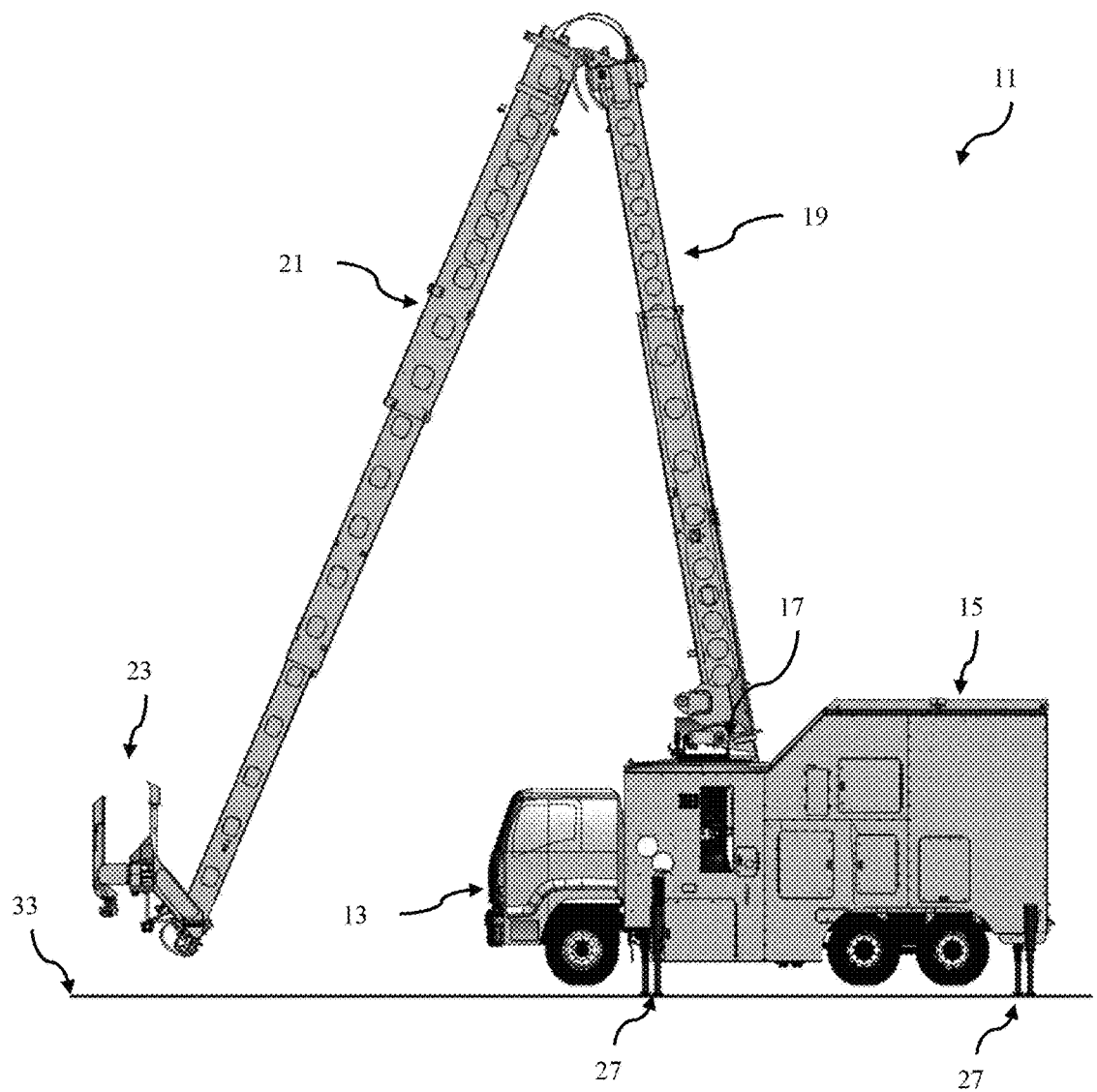
FIG. 2B is a side view of the bricklaying robot of FIG. 2A.

Perspective and side views of an embodiment of an automated bricklaying robot 11 are shown in FIGS. 2A and 2B. In this embodiment automated brick laying robot machine 11 has a base 13 in the form of a truck with a turntable in the form of a tower (or turret) 17 supported on a vertical yaw axis, and an articulated arm having a telescoping boom 19 supported on the tower 17 about a horizontal pitch axis about which the arm may be raised or lowered. The boom 19 has a telescoping stick 21, mounted on the end of the boom 19 about a horizontal pivot axis, and an end effector 23 in the form of an adhesive applying and brick laying head 23 mounted to the remote end of the stick 21. For the sake of convenience, the end effector/adhesive applying and brick laying head will simply be referred to as the layhead. The base 13 is stabilised relative to the ground 33 by legs 25 (i.e. outriggers) with jack-down feet 27. Bricks are stored in a storage area 15 of the truck and a conveyor inside the arm conveys the bricks from the truck 13 to the layhead 23.

Figure 3:
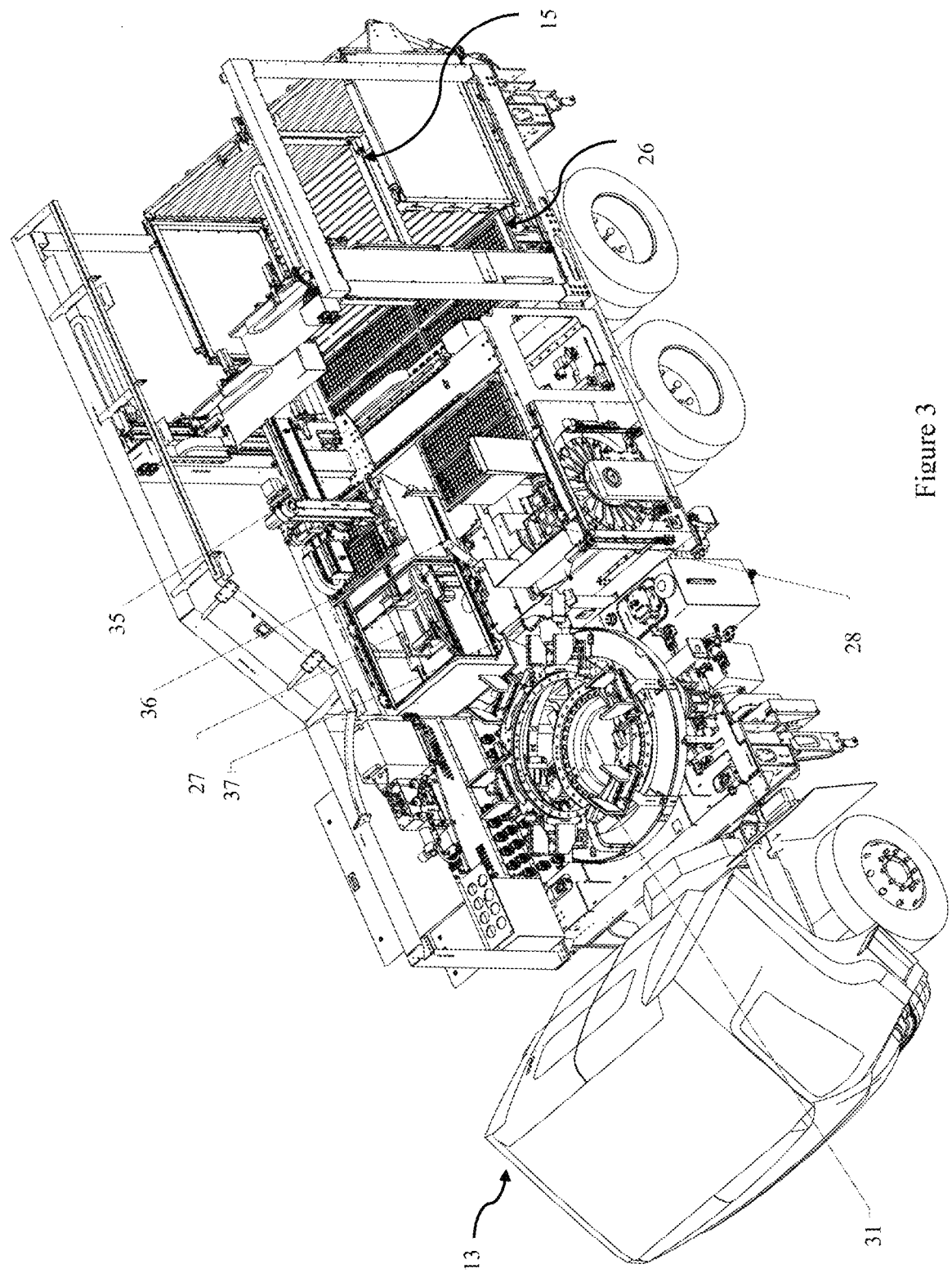
FIG. 3 is a perspective view of the bricklaying robot of FIG. 2A according to an embodiment.

FIG. 3 is a perspective view of the bricklaying robot of FIG. 2A. Bricks are stored in pallets in storage area 15 at the rear of the truck. A dehacker robot picks up bricks from a pallet and moves them to a temporary storage location 26 where a transfer robot 35 picks up individual bricks and transfers the brick to a carousel 31 that feeds a conveyor at the base of the tower 17 to send the brick to the layhead. The transfer robot 35 may cut and rout the bricks using cutter station 27 and router station 28. After any cutting or routing, a quality control station comprising at least one 3D scanner 29 (here shown as two laser scanners 36, 37) scans the brick to generate a 3D model 123 of the brick which comprises the dimensions of the brick. A control system 110 comprising one or more processors 112 and a memory 114 are located on the base, and is configured to control the operation of the machine, including movement of the robotic components and tasks such as coordinating scanning of the brick 16 by scanner system 29 and imaging bricks by vision system 1 as will be described in further detail below.

Figure 4A:
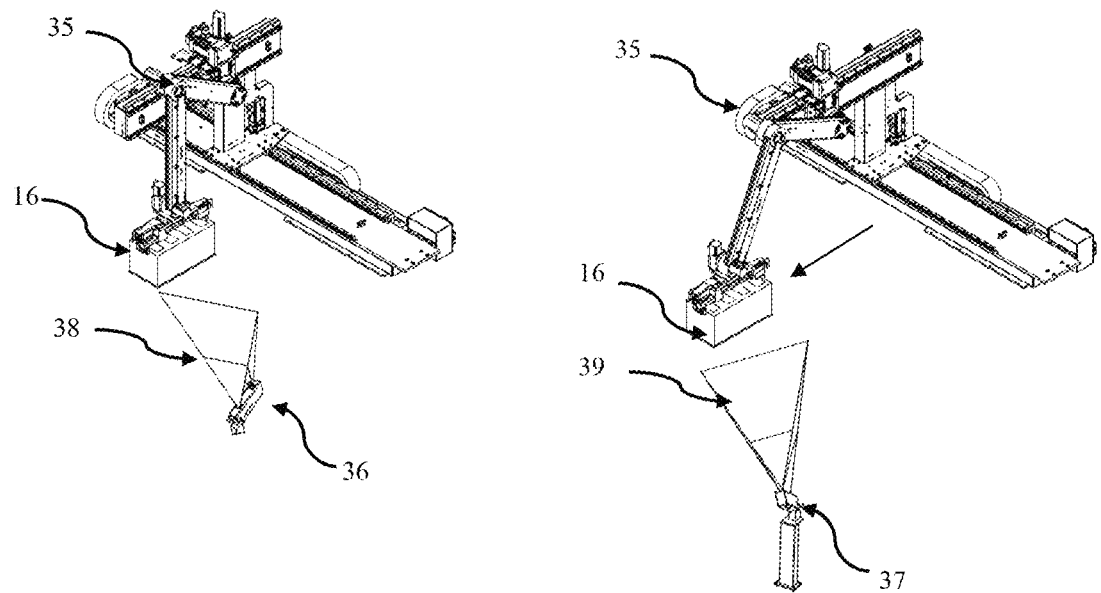
FIG. 4A is a perspective view of a brick scanning system according to an embodiment.

FIG. 4A provides perspective views of a 3D brick scanning system according to an embodiment. In this embodiment the transfer robot 35 grips the brick and two laser scanners 36 and 37 are each positioned at an angle abnormal with respect to the brick, with scan field of views 38 and 39 respectively to generate a 3D model of the brick 123, shown in FIG. 4B. This configuration allows 3D scanner 29 to scan all 5 faces of the brick with the two lasers. Based on the angles shown in FIG. 4A, each laser can see 3 brick faces and thus between the two laser scanners 36 and 37, 5 faces of the brick become visible. The top face cannot be scanned due to the transfer clamp of the transfer robot 35. In one embodiment the first scanner has a 6DOF position relative to the centroid of the brick of (−415 mm, −325 mm, −465 mm, 12°, 35° and 26.5°), and the second laser scanner has a 6DOF position relative to the centroid of the brick of (−415 mm, −325 mm, −465 mm, 12°, 35° and 206.5°). The order of rotation is C→B→A, where the secondary laser scanner is rotated around the centroid of the brick on the Z axis by 180 degrees, and the brick moves past the scanners at a speed of 300 mm/s.

Figure 4B:
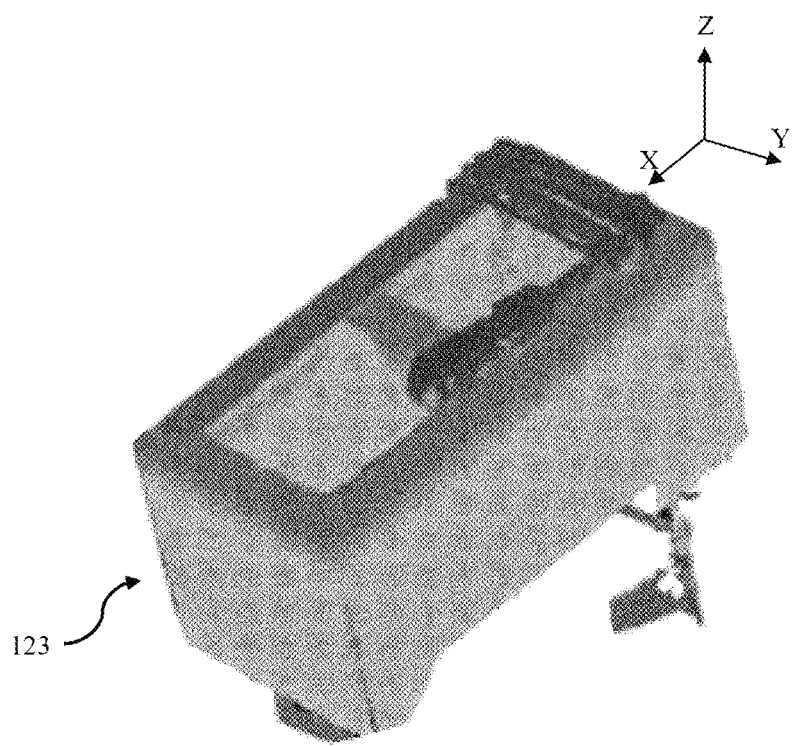
FIG. 4B is a 3D model of a brick captured using the brick scanning system of FIG. 4A according to an embodiment.
Figure 5A:
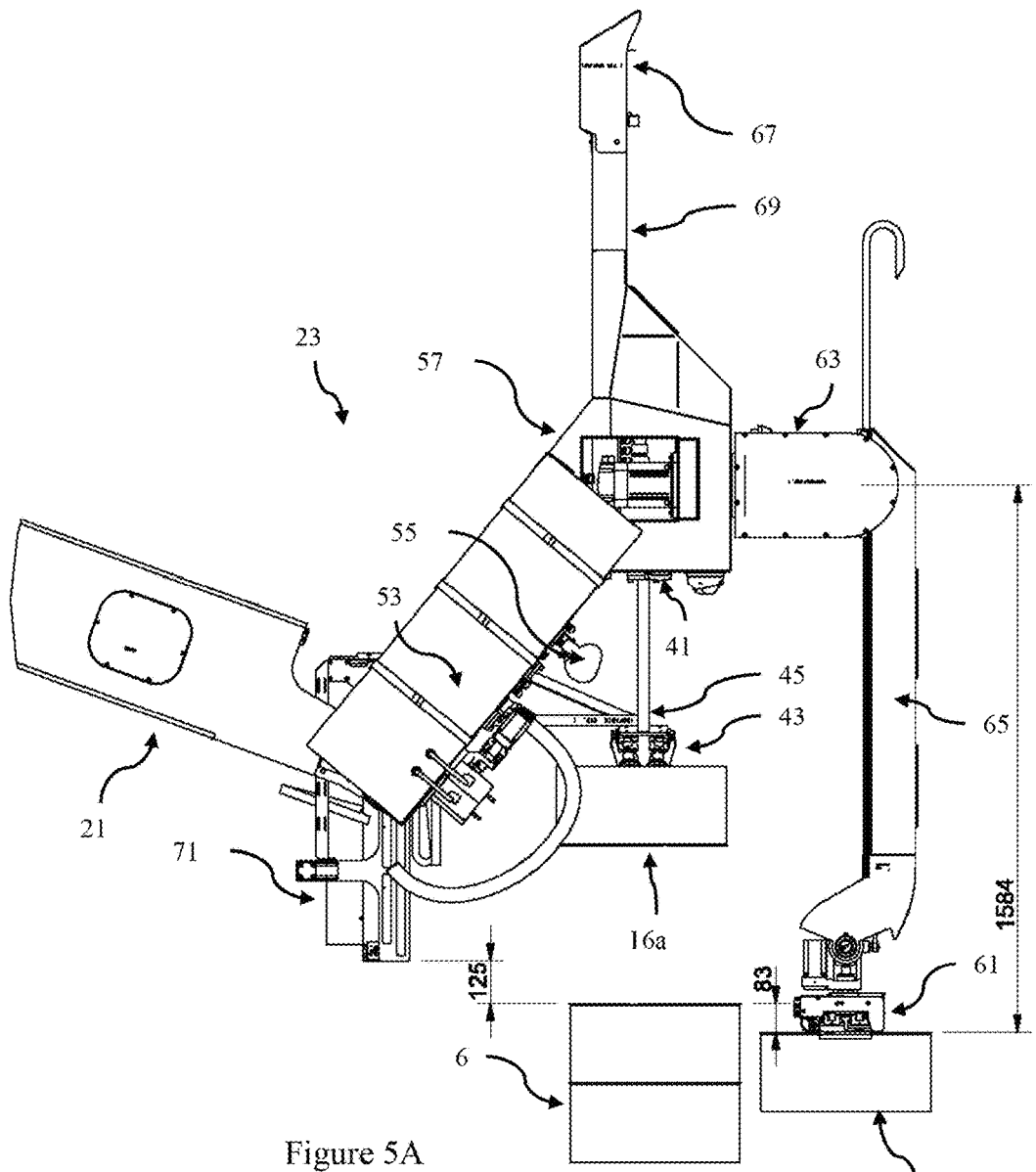
FIG. 5A is a side view of an end effector according to an embodiment.
Figure 5B:
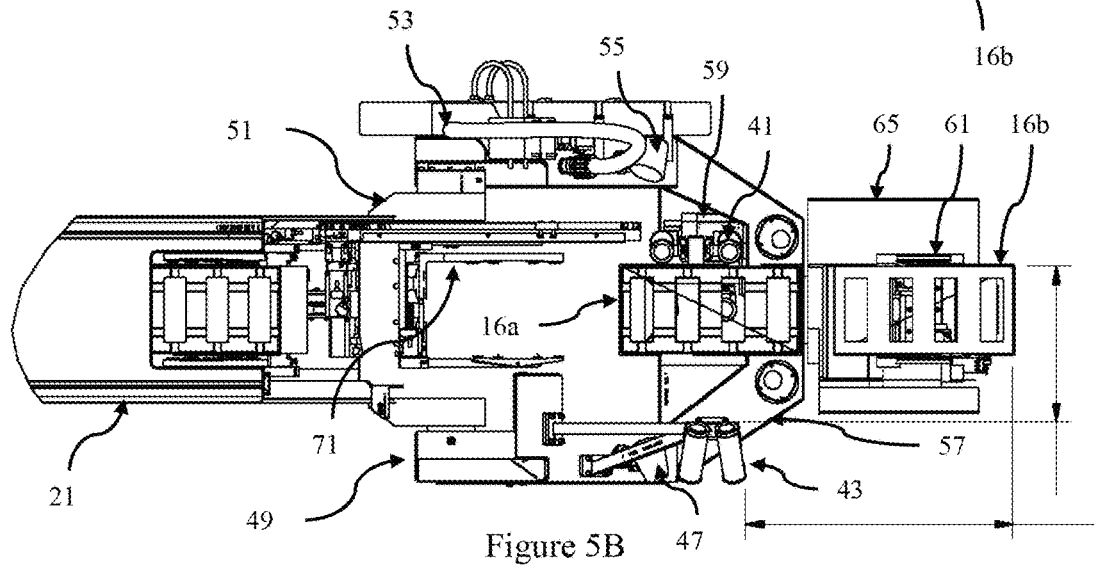
FIG. 5B is a bottom view of the end effector of FIG. 5A according to an embodiment.
Figure 5C:
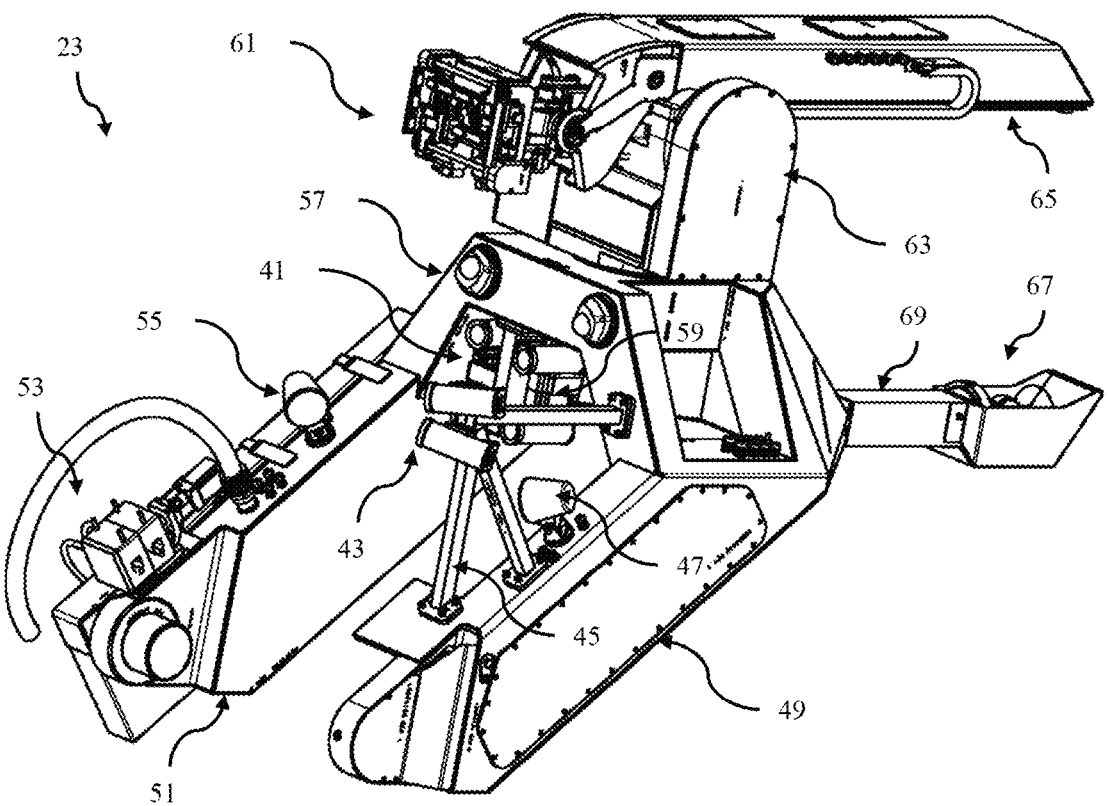
FIG. 5C is a first perspective view of the end effector of FIG. 5A according to an embodiment.
Figure 5D:
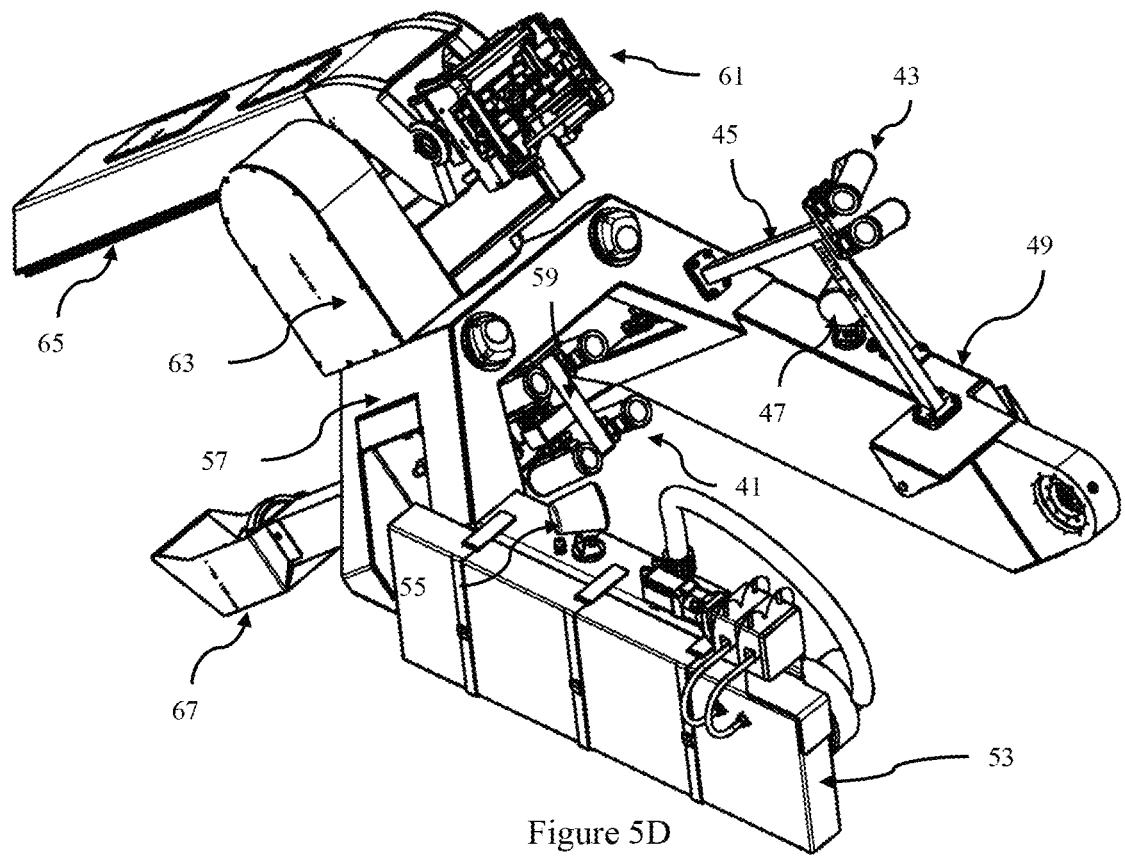
FIG. 5D is a second perspective view of the end effector of FIG. 5A according to an embodiment.
Figure 5E:
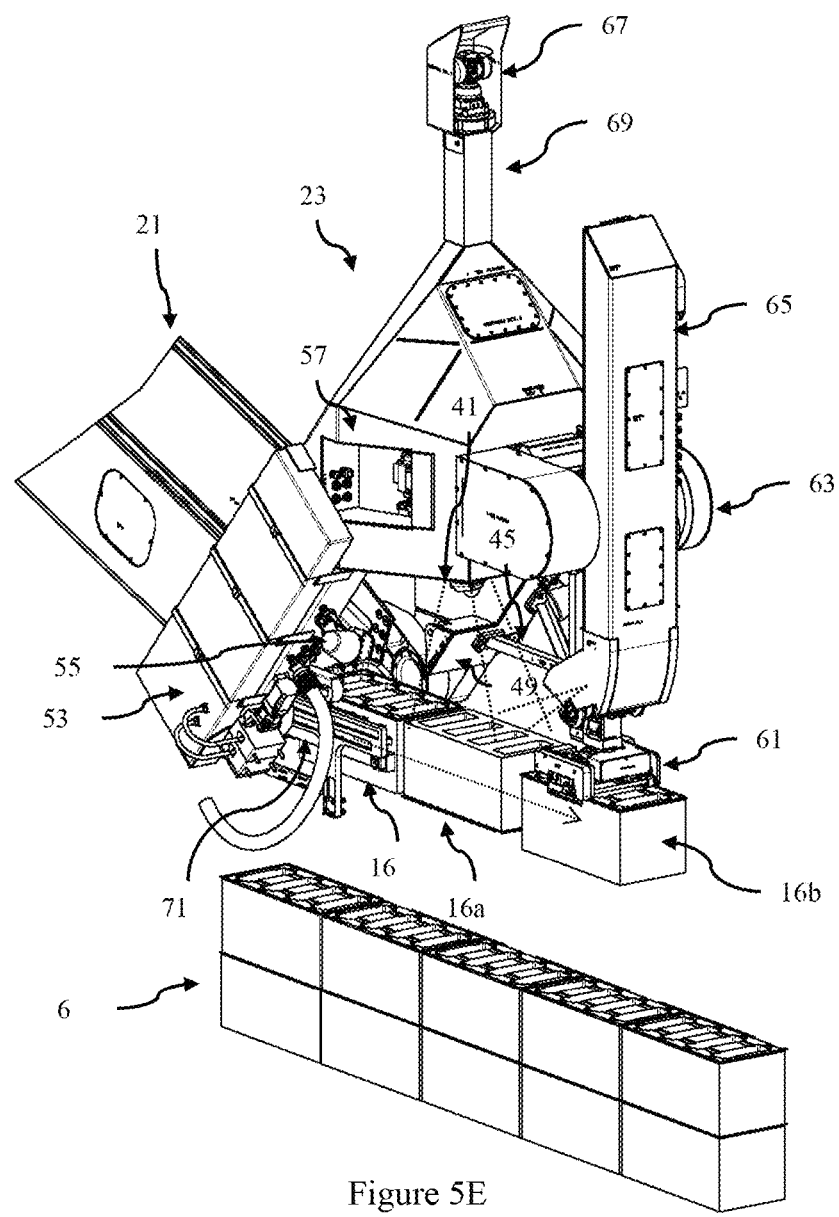
FIG. 5E is a third perspective view of the end effector of FIG. 5A according to an embodiment.

The scan data may be processed by the laser scanner to generate a 3D model of the brick 123 such as shown in FIG. 4B, or a processor associated with control system 110 may process the laser scan data and generate the 3D model of the brick 123. The 3D model may be a point cloud model, or a surface mesh based model, and the processor may determine dimensions and coordinates of specific features of the brick (edges, corners, etc) In other embodiments other scanning systems using light, radio frequency, ultrasound, or computer based vision systems that capture images and reconstruct the geometry of the brick can be used. In some embodiments a 3D scanner 29 may be omitted and database system 116 may store 3D models 123 of the brick. These may be obtained previously, in which case an ID scanner is used to determine the ID of the brick, for example using a barcode reader or camera-based vision system that recognises an ID printed on the brick etc. Alternatively or additionally the 3D model of the brick may be based on previously generated virtual or CAD model of the brick or object. In some embodiments an ID scanner is located with the laser scanner to identify an ID of the brick and associate the 3D scan with the brick ID. The 3D model may also be compared against an expected model of the brick (for example stored in a CAD model in database 116) to check that the brick has the required dimensions, particularly after any cutting or routing operations. Whilst a 3D model is described in this example, a 2D model may be used instead, for example a 2D shape model of a top face of the brick.

FIGS. 5A to 5E are a side view, bottom view, a first perspective view, a second perspective view, and a third perspective view of a layhead incorporating components of a vision system according to an embodiment. As mentioned above, the brick is transported to the layhead 23 where a robotically controlled flipper clamp 71 receives (grasps) the brick 16 and holds it so that an adhesive can be applied using an adhesive dispensing system. Then the brick is flipped 180 degrees and presented for pickup (shown schematically as brick 16a) by a gripper of a robotic laying arm 65 that grasps the brick and places the brick (16b) at the desired location on wall 6. As the exact position of the brick with respect to the layhead (or local coordinate system of the robot) is not accurately known, a vision system is used to determine the precise 6DOF (x, y, z, a, b, c) location of the brick in the local coordinate system of the robot (e.g. layhead coordinate system). The robotic laying arm 65 uses the 6DOF location to precisely grip and take the brick (16*a*) from the jaws (i.e. clamp) of the flipper assembly 71 and moves it to a position where it is laid on wall 6. The robotic laying arm 65 also compensates for movement and deflection of the boom, so that the brick is laid in the correct position using a stabilisation and tracking system.

The layhead 23 comprises a body 57 with arms 49 and 51 forming a clevis which extends obliquely downward from the body 57. The arms 49 and 51 have apertures to receive pins to pivotally mount the head 23 and the flipper assembly 71 about a horizontal axis at the distal end of the stick 21. The layhead 23 articulates about a horizontal axis substantially parallel to the articulation axis of the stick 21 and the articulation axis of the boom 19. The pose of the layhead 25 is controlled by movement of a ram. A first camera assembly 41 is mounted on the body 57, a second camera assembly 43 is mounted on first arm 49 and an adhesive container and adhesive application system 53 is located on arm 51. Lights 47 and 53 are mounted to arms 49 and 51 for illuminating the brick to ensure adequate exposure for the vision system.

In the example shown, the robotic laying arm (i.e. robotic gripper arm) 65 is a spherical geometry robot 36 comprising a linearly extendable arm with a brick laying clamp 61 in the form of a gripper fitted at the lower end of the arm. The linearly extendable arm 65 is mounted to body 57 via a mount 63. The arm 65 has linear guides which co-operate with bearing cars on the base of the mount to guide linear extension of the arm relative to the mount, to allow the arm 65 to move in a direction (typically straight up and down, but this depends on the pose) normal to the axis of the clevis of the mount in order to provide sliding movement of the arm 65. This linear extension of the arm is controlled by a servo motor attached to the base of the mount with reduction drive pulleys connected by a toothed belt driving a pinion engaging a rack located extending along the arm 65. The brick laying clamp/gripper 61 comprises a servo motor controlled mechanism to provide the gripper yaw angle adjustment; wrist pitch angle adjustment; and wrist roll angle adjustment. The jaws of the gripper 61 are independently movable by servo motors to allow the offset gripping of a brick.

In one example, a tracker component 67 is located on a mast 69 extending from the body 57 of the layhead. An additional reference tracker component may be set up on the ground 33 adjacent to the robot. The tracker component 67 may be a Leica T-Mac or an API STS (Smart Track Sensor). Alternately tracker component 130 may be a single SMR (Spherical Mount Reflector) or corner cube reflector, or two or three SMRs or corner cube reflectors or a Nikon iGPS or any other suitable tracking device. Preferably the tracker component 67 provides real time 6 degrees of freedom position and orientation data at a rate of 1000 Hz or more which is used to provide dynamic compensation to the robotic laying arm 65 in order to account for dynamic disturbances such as oscillation and vibration due to wind, boom movement etc.

Figure 6A:
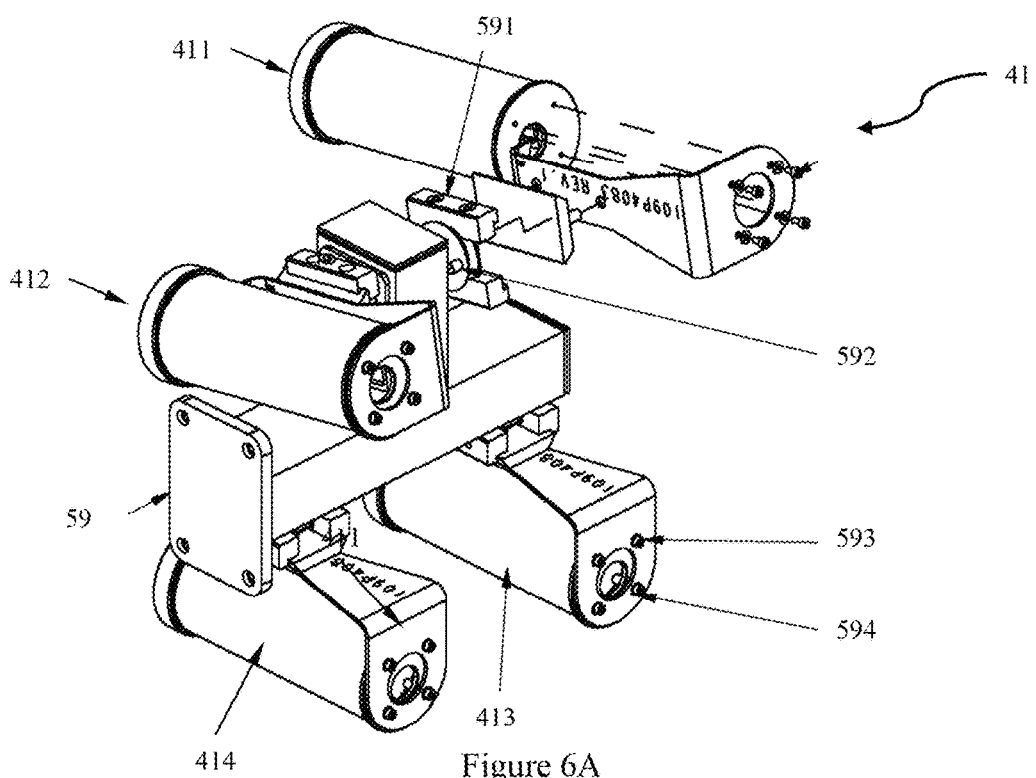
FIG. 6A is a perspective view of a top camera assembly according to an embodiment.
Figure 6B:
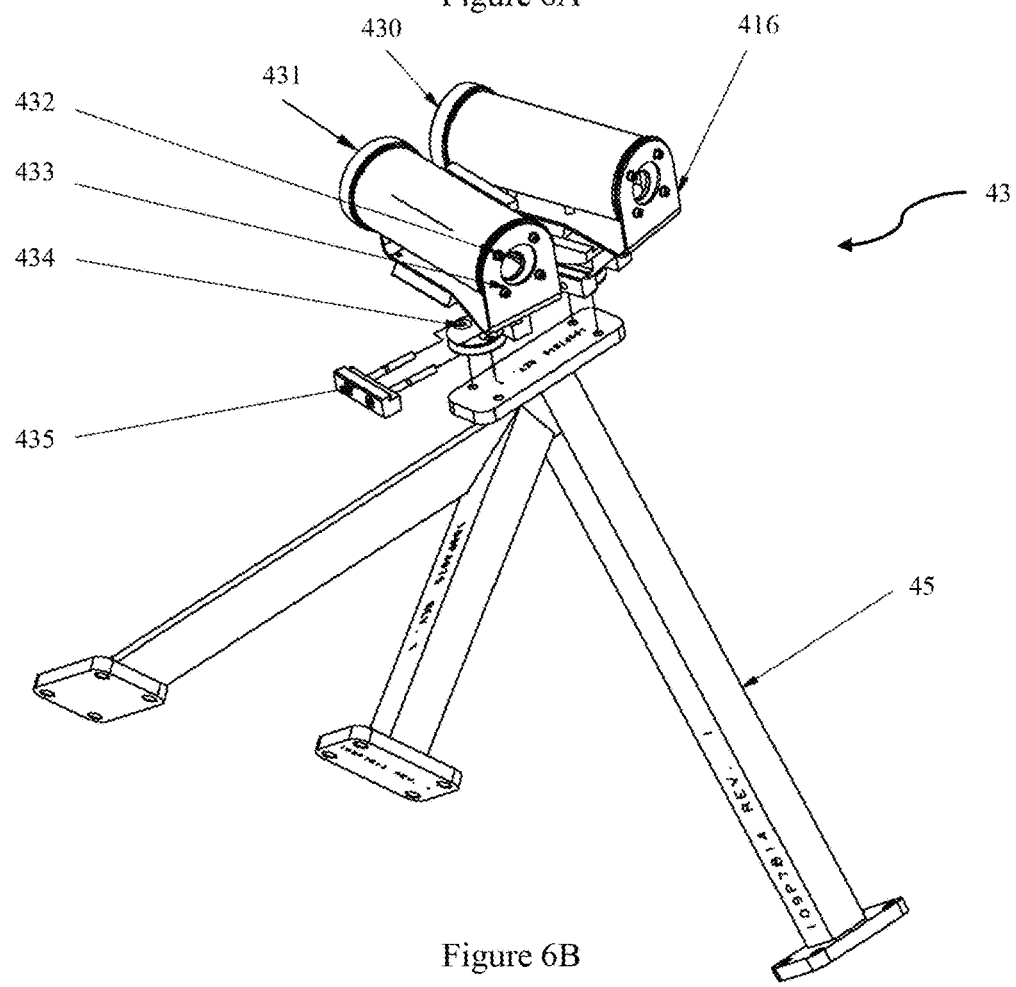
FIG. 6B is a perspective view of a side camera assembly according to an embodiment.
Figures 7A, 7B, 7C:
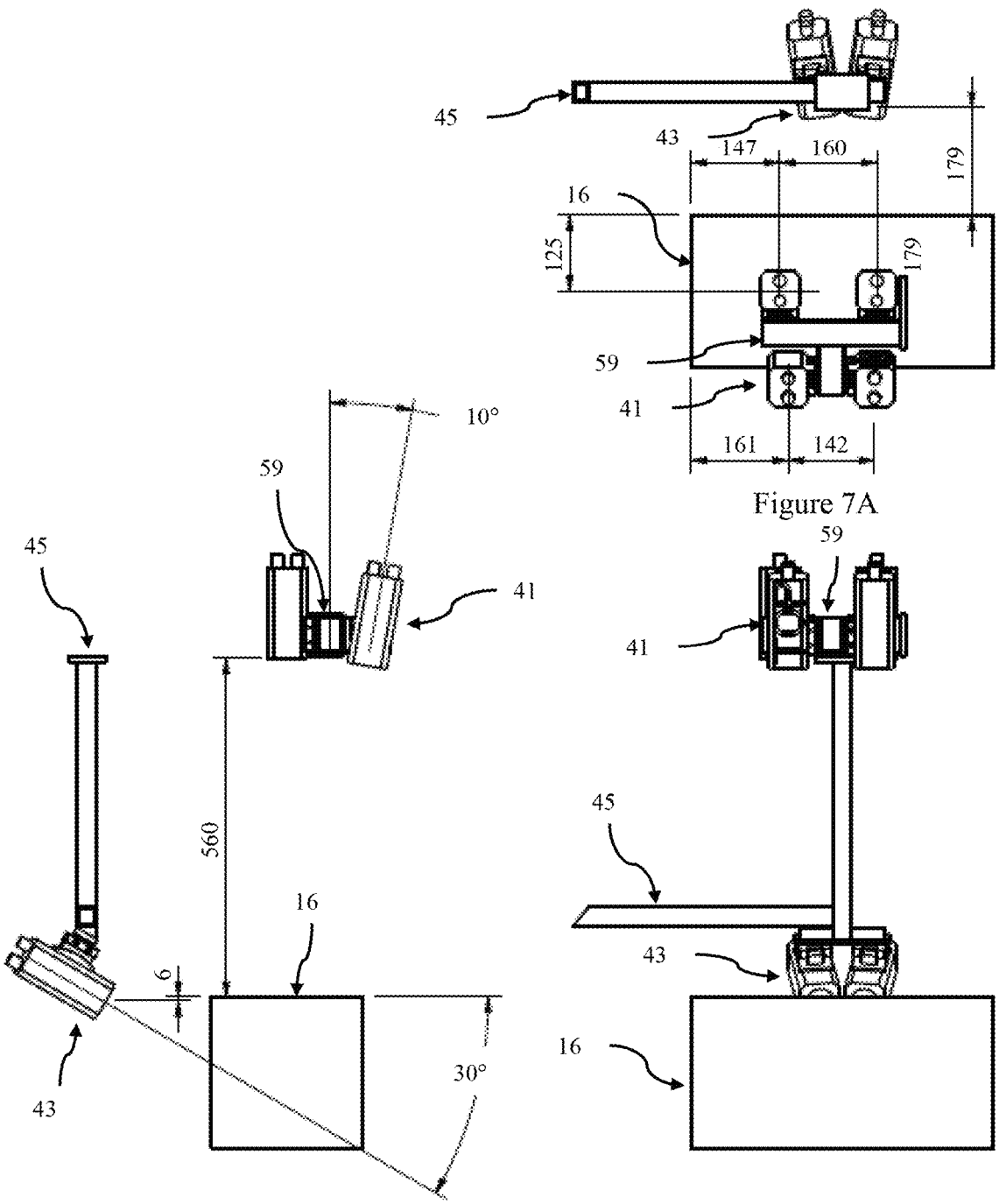
FIG. 7A is a top view of the top and side camera locations according to an embodiment.
FIG. 7B is a side view of the top and side camera locations according to an embodiment.
FIG. 7C is a rear view of the top and side camera locations according to an embodiment.

FIGS. 6A and 6B are perspective views of a top camera assembly 41 and a side camera assembly of a vision system shown in FIGS. 5A to 5E according to an embodiment. Further FIGS. 7A to 7C show top, side and rear views of the top and side camera locations of the vision system when mounted on the layhead shown in FIGS. 5A to 5E.

The vision system is used to determine the precise 6DOF location of the brick 16 so that the robot arm 65 can be controlled to pick it up correctly. However due to mechanical constraints the space in the layhead is limited, and optimal fields of view of the brick are not possible. Further the flipper 71 obstructs some surfaces of the brick. Thus only images of two sides of the brick are able to be captured. In one embodiment the vision system is required to estimate the brick pose in 6DOF with a centroid known to 0.1 mm and within 0.1°, and the vision system must provide the 6DOF position within 2 s. This task is made more difficult due to the varied range of outdoor conditions the robot is required to operate in—this includes temperatures ranging from 0-50 C, rain, dust, wind as well as full daylight, twilight and dark night lighting conditions. This places significantly demands on systems for determining the location of the brick to enable precise placement of the brick.

In this embodiment, the first camera assembly 41 comprises an array of 4 cameras 411, 412, 413, 414 mounted on mount 59 which comprises individual mounts from a pivot mount 592 which supports a plate which the cameras are secured to, for example by screws 593 594. The pointing direction and location of each camera can be adjusted, and is measured (and known) as part of a calibration and/or setup process. The second camera assembly 43 comprises two cameras 430, 431 on 3-legged mount 45 which mounts the second camera assembly orthogonally to the first camera assembly (with two of the legs attached to the side 49 and one leg to the body 57 of the layhead). The two cameras are each mounted on a pivotable mount 435 which supports a plate 434 which the cameras are secured to, for example by screws 433, 434.

Figure 8A:
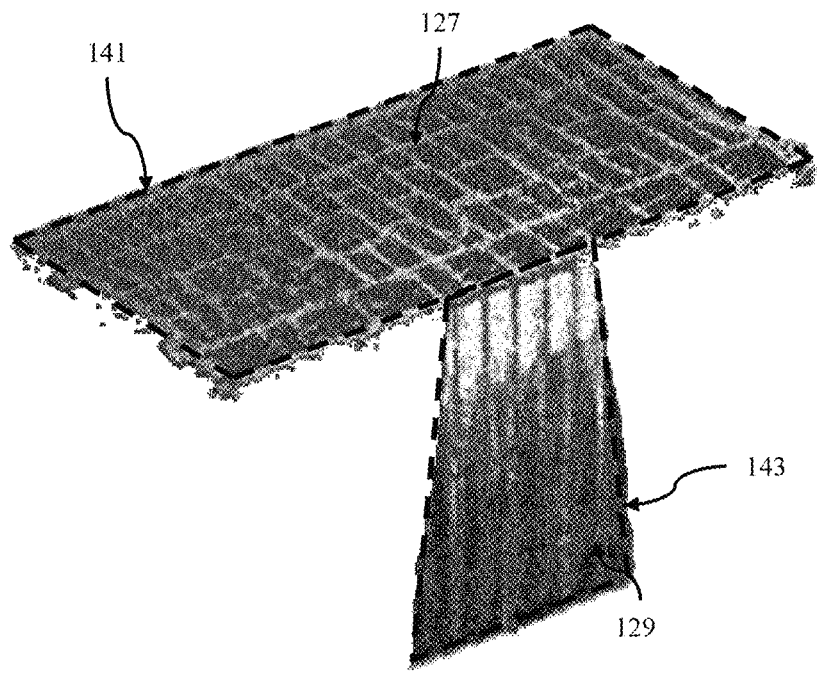
FIG. 8A is a point cloud representation of faces of a brick according to an embodiment.

In this embodiment the first camera assembly 41 is arranged as pairs of stereoscopic cameras that capture images simultaneously to generate a point cloud representation of a field of view of the camera pair. In this embodiment the pair of cameras are offset by 10°. However, in other embodiments a Time of Flight (ToF) laser scanner could be used as the image sensor. In this embodiment the first camera assembly is located nominally 560 mm from the top face of the brick 16. Each camera takes an image and the images are combined to generate a point cloud representation using a composite image 127 of the top face as shown in FIG. 8A. The second camera assembly 43 is only required to capture a portion of a side face and thus can be considerably closer to the brick 16. In this embodiment the side cameras are located nominally 179 mm from the side face of the brick. The two side cameras capture a portion of the side face 129 as shown in FIG. 8A and a point cloud representation of the side face is then generated. This point cloud data is then combined with the 3D model of the brick (obtained from the laser scanner 29) to generate a 6DOF position for the brick which is provided to a controller for the gripper 61 of the layhead robot 65 which then grabs the brick from the flipper 71. In other examples, a 2D model of the brick (e.g. of the top face) may be used in the analysis.

In one embodiment, the vision modules receives the brick's unique ID, and obtains the dimensions of the brick from the 3D model provided by the laser scanner 29 and stores in a SQL database. Once the adhesive is applied the brick is held still (waiting for pickup) and the camera array is triggered. The output of the vision module provides the 6DOF location or pose of the brick. In one embodiment, the 6DOF location is returned as an offset from an ideal pickup location, and hence is used as a correction offset during pick-up of the brick by the gripper 61. In this embodiment a return result of (0, 0, 0, 0, 0, 0) means the brick is exactly where it should be. The 6DOF location comprises (X, Y, Z, A, B, C) where (X, Y, Z) are the coordinates in a local coordinate system of the robot and (A, B, C) are 'Tait-Bryan' angles z-y-x.

FIG. 1B is a schematic outline of an example of a method for determining the 6DOF location (i.e. pose) of the brick. In one embodiment, a 3D model 123 of the brick is obtained, for example by generating a 3D model of the brick using the laser scanner 29. Alternatively, a 2D or 3D model may simply be retrieved from memory and may be a CAD model or other ideal user generated model rather than a scanned model of the actual brick. At step 124 the first camera assembly and the second camera assembly are used to capture images of the first and second faces of the object—such as 2 adjacent sides of the brick. As shown in FIG. 8A, the first image is a full or complete image of the first face of the brick 127 (i.e. visible from above). In this embodiment two pairs of cameras (4 in total) are used to capture this image, but a single pair of cameras with a sufficiently wide field of view could be used, or even a single ToF camera with a large field of view. The second camera assembly 43 captures a portion of a second face of the object 129. The portion of the second face comprises a first edge where the first face meets the second face and the portion may optionally extend orthogonally to an edge opposing the first edge. Thus as shown in FIG. 8A, the full height of the side is imaged but not the full width. A point cloud representation of at least part of the object using image data obtained from the captured images of the first and second faces can then be generated.

Figure 8B:
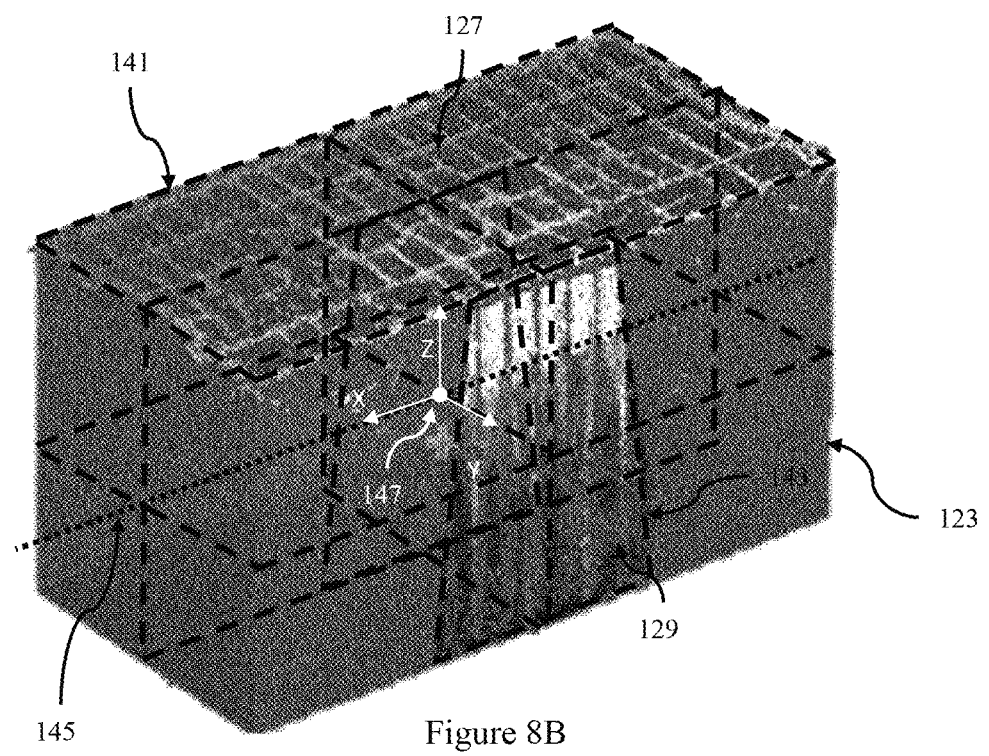
FIG. 8B shows a 3D model of the brick located in the point cloud of FIG. 8A according to an embodiment.

Next at step 126 a first plane 141 is fitted to first image 127 of the top surface and a second plane 143 is fitted to the image 129 of the portion of the second face using the point cloud representation. In this embodiment the two planes are planar surfaces that intersect orthogonally. Once the two planes are fitted a pose of the first plane and a pose of the second plane can be determined using the known location and a field of view of the cameras in the local coordinate system. The two planes can be offset by half the known brick dimensions (from the 3d model, database etc.) and intersected to define an intersection line running through the centre of the brick. That is the planes of best fit (fitted to the top and side faces) and each offset by half the relevant brick dimension which provides intersecting planes through the middle of the brick that define a line extending through the centre of the brick lengthwise. This is illustrated in FIG. 8B. At this point in time the location of the two planes and/or line of intersection in the local coordinate system is known. However, the X value of the brick is unknown and is still to be determined (in other words it is unknown where on the model the side plane is located in the x-direction).

Thus to further constrain the location of the brick and determine the 6DOF location (additional dimension and Tait-Bryan angles/angular offsets), the 3D model of the brick, for example from the laser scanner 29 is then fitted or matched to the two planes to determine the 6DOF location 147 of the object using the dimensions of the 3D model of the object, together with the location and orientation of the first plane and the location and orientation of the second plane (step 128). This allows the x dimension to be determined as well as angular offsets. The estimate of the 6DOF output in local coordinates is then output. This fitting step 128 is further illustrated in FIG. 8B showing the first plane 127 and second plane 129 fitted to the 3D model 123. Intersecting line 145 is formed from the intersection of offset planes 141 and 143. In the case of a 2D shape model, for example of the top face of the brick, a shape match is performed by fitting the shape model to the top face of the composite image 127 or point cloud representation thereof.

Table 1 shows a more detailed algorithm of an example for estimating the 6DOF location of the brick.

TABLE 1

Detailed algorithm for estimating the 6DOF location of the brick.

| Step | |
|---|---|
| 1 | Pre-generate a bounding rectangle for later use based on the 3D model of the brick |
| 2 | Reconstruct a point cloud from the 6 images |
| 3 | Clean the point clouds to remove noise, as well as points that don't lie on the relevant faces. Points inside the brick i.e. points on the sides of the cores will be removed |
| 4 | Fit planes of best fit onto the top face along with the side face |
| 5 | Offset the two planes by half their relevant measured brick dimension. This results in the planes splitting the brick in half on their relevant axes |
| 6 | Intersect the two planes to produce a line through the centre of the brick lengthwise |
| 7 | Use the top plane's pose to rotate the inverse poses of the two cameras assemblies |
| 8 | Remove the distortion from the images from both cameras. |
| 9 | Generate a virtual camera with pointing direction orthogonal to the top plane of the brick. |
| 10 | Perform transformations on the corrected images to project them onto the virtual camera's plane. |
| 11 | Tile the two images to produce a full image of the top of the brick |
| 12 | Perform a shape match to find the brick in the tiled image |
| 13 | Transform the found shape match to the point cloud co-ordinates. |
| 14 | Represent the X value of the match as a plane. |
| 15 | Find the intersect between the line and the X position plane. |
| 16 | The intersection is the centroid of the brick. The rotations are calculated from the orientations of the top and side planes. |
| 17 | Generate a box representation of the 6DOF found. |
| 18 | Render an image for output. |

In this method, a point cloud is reconstructed of the top and side faces of the brick from the camera images. Some additional noise filtering is performed on the point cloud and then planes of best fit are fit to the top and side faces. The two planes are then offset by half their relevant measured brick dimension. This results in the planes splitting the brick in half on their relevant axes. The intersection of the two offset planes produces a line through the centre of the brick lengthwise. The method then includes generating a virtual camera orthogonal to the first plane using a pose of the first plane and inverse poses of the first sensor apparatus. The method further includes transforming the captured images from the first sensor apparatus (at least the first sensor pair located nominally above the object) to project them onto the virtual camera's plane so as to form virtual camera images; and, combining (i.e. tiling) the virtual camera images to generate a composite image. Prior to transforming the images, distortion may be removed from the original images due to location of camera relative to the object so that corrected images are transformed.

For a 2D shape model of the first face, the shape match is performed by locating the shape model in the composite image of the first face. In this example, the point cloud data is only used to fit the first plane and generate the virtual camera. There is no additional processing of the point cloud. The actual images taken by the first sensor apparatus are transformed so as to project them onto the virtual camera's plane (i.e. as if the images were taken by the first sensor apparatus located directly above the first face and orthogonal thereto). The shape match is then performed by fitting the shape model to the transformed composite image.

The found shape match is then transformed into to the point cloud co-ordinates, and the X value of the match is represented as a plane. The intersection of the line (step 6) and this plane is then used to define the centroid location of the brick, and the rotations can be calculated from the orientations of the top and side planes to determine the pose in 6DOF.

As an alternative to the above method, a second or modified point cloud representation of the first face may be generated by mapping first point cloud data from the original image capture in accordance with the virtual camera. In other words, each point in the first point cloud is transformed so as to generate the point cloud as if derived from images taken by the virtual camera (i.e. looking straight down onto the first face of the object). It is the same point cloud but viewed from a different perspective such that the resultant point cloud resembles the proper dimension and shape of the first face of the object (in the original point cloud, the first face may be skewed and/or oblique). For a 2D shape model of the first face, the shape match is then performed by locating the shape model in the second point cloud representation of the first face.

Various modifications and variations are possible. For example in the above embodiment the brick is held in place whilst images are taken and the 6DOF location estimated, before the gripper 61 of robotic laying arm 65 is allowed to grasp and lay the brick. Preferably collection of images and 6DOF location estimation takes under 2 seconds, which can be achieved using a multi core CPU (for example a six core CPE with 2 core per analysis). This is so that at the time the gripper 61 grasps the brick the precise location of the brick is known. However in another embodiment as soon as images are taken, the gripper may be allowed to grasp and take the brick and assumes the brick is at a reference location. Then the 6DOF location is provided to the controller for the robotic laying arm 65 as an offset from the reference location as soon at becomes available, and prior to laying of the brick. Provided this latter condition is achieved, the controller can perform an adjustment using the 6DOF offset to the intended laying location (i.e. based on the assumption that the brick was in the reference location).

In the above embodiment, 4 cameras in two stereoscopic arrangements are used to capture an image of the top surface. However, in another embodiment a set of two cameras could be used provided they had a large enough field of view, or the two could be translated or moved between two capture locations. Further in one embodiment two stereoscopic cameras or a ToF sensor could be mounted on a slide track to capture images of the two faces. In this case the track could move between the two mounting positions shown in FIGS. 5A to 5E.

In the above embodiments the planes are fitted as planar surfaces. However in some embodiments this requirement could be relaxed, and non planar surfaces could be fitted to cope with non planar surfaces and curved surfaces. For example in some embodiments the object could be a pipe or cylindrical object rather than a brick. In this embodiment one surface is the planar end and the other surface is the curved outer surface with fixed radius of curvature. This places constraints on the geometry allowing the planes and model to be fitted as outlined above.

The vision system can also be used for data logging. For example an image of the adhesive on the brick can be captured and stored for quality control or quality assessment images.

Figure 9:
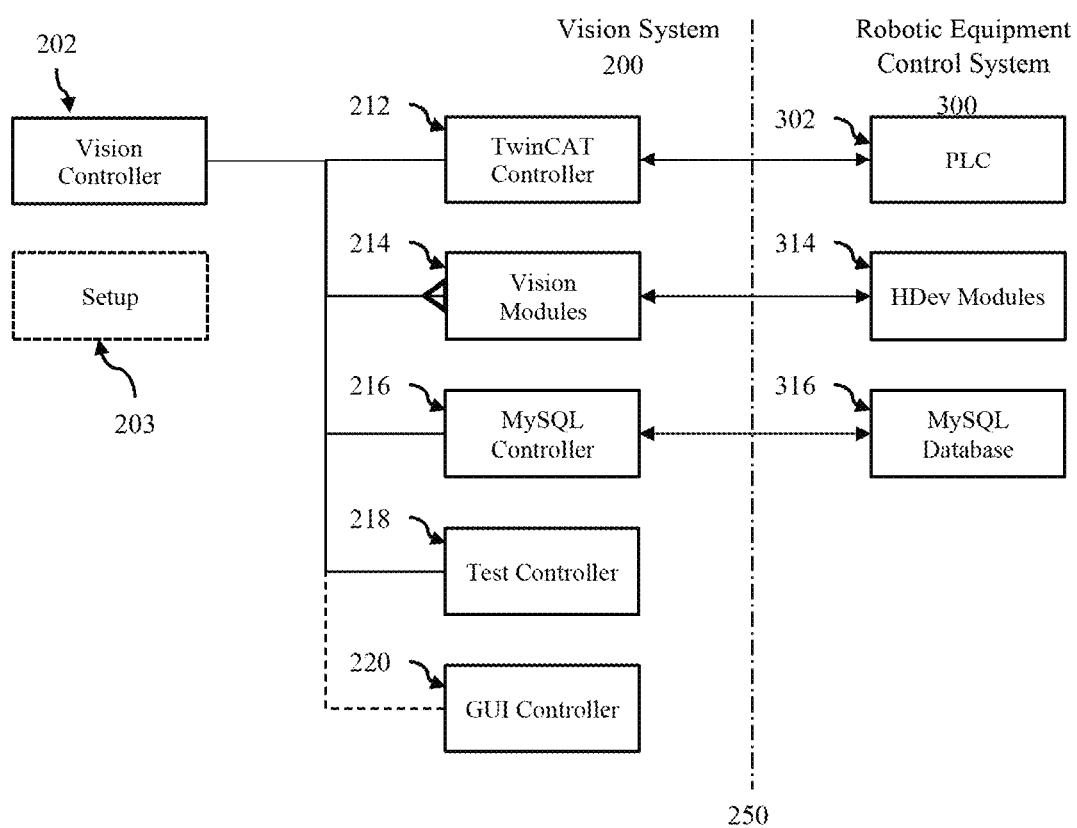
FIG. 9 is a schematic diagram of the major vision system modules according to an embodiment.

FIG. 9 is a schematic diagram of the major vision system modules according to an embodiment. The vision system 200 is a separate subsystem or set of modules that operates in conjunction with the primary control system (PLC) 302 of the robotic bricklaying equipment, and provides guidance and correction for the control system PLC. The vision system 200 runs parallel to the control system (PLC) and monitors variables inside the PLC and operates accordingly. It may be hosted on a separate computing apparatus or form part of a multi-processor server apparatus.

The Vision Controller 202 is the primary control module within the vision system, and houses all other modules and controllers within the system. The Vision Controller is the sole vision system module provided access to communicate with the Control System (PLC) via the TwinCAT controller (communications interface). During setup 203 the Vision Controller initialises all the other controllers (TwinCAT Controller 212, Vision Modules 214, HALCON (HDev) engine and the Test Controller 218, and GUI Controller 220) which then run independently upon initialisation. The test controller performs test and calibration and the GUI controller is an optional component to extract information from the vision system and display on a screen.

Build information is stored in a MySQL database 316. This comprises CAD models of the build and bricks (eg as CAD STL files), brick IDs, process instructions (where to cut and route) CAD model dimensions, as well as the actual scanned 3D model and actual brick dimensions from laser scanner 29. After a brick is scanned by the laser scanner 29, the actual 3D scan model is stored in the MySQL database and is compared with the CAD (STL) model of the brick to verify that the processed brick in the machine (ie after cutting and routing) matches the required brick. The MySQL Controller 216 interfaces with the MySQL database to obtain the 3 dimensional (3D) model of the brick for estimating the 6DOF position of a brick in the layhead. CAD STL information is provided to the MySQL database via a FTPS server from a folder titled with the build ID.

The vision modules 214 execute the vison system functionality including software modules that implement embodiments of the methods described herein to capture images and to determine the 6DOF location of a brick at the layhead.

The processing of signals may be performed directly in hardware, in a software module executed by a processor, or in a combination of the two. For a hardware implementation, processing may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. Software modules, also known as computer programs, computer codes, or instructions, may contain a number a number of source code or object code segments or instructions, and may reside in any computer readable medium such as a RAM memory, flash memory, ROM memory, EPROM memory, registers, or any suitable form of computer readable medium.

In one embodiment the processing is performed by one or more computing apparatus 110 comprising one or more central processing units (CPU) 112, a memory 114, and an Input/Output interface. The computing apparatus may further include a graphical processing unit (GPU), a communications module (if not integrated into the CPU or Input/Output interface), and input and output devices such as keyboard, mouse, touch screen, displays, etc. The CPU may comprise an Input/Output Interface, an Arithmetic and Logic Unit (ALU) and a Control Unit and Program Counter element. The Input/Output Interface may comprise lines or inputs for receiving signals or data from the sensors. A communications module may form part of the CPU or be connected to the CPU via the Input/Output interface, and be configured to communicate with a communications module in another device using a predefined communications protocol which may be wireless or wired (e.g. Bluetooth, WiFi, Zigbee, IEEE 802.15, IEEE 802.11, TCP/IP, UDP, etc). The computing apparatus may be a server, desktop or portable computer and may comprise a single CPU (core), multiple CPU's (multiple core), multiple processors, parallel processors, vector processors, or be may be part of a distributed (cloud) computing apparatus. The memory is operatively coupled to the processor(s) and may comprise RAM and ROM components, and secondary storage components such as solid state disks and hard disks, which may be provided within or external to the device. The memory may comprise instructions to cause the processor to execute a method described herein. The memory may be used to store the operating system and additional software modules or instructions. The processor(s) may be configured to load and execute the software code, modules or instructions stored in the memory.

The software modules that contain computer code for implementing the vision system described herein may be we written in a high level language such as C# or Java. Image processing functions and related image processing libraries such as MATLAB libraries, OpenCV C++ Libraries, ccv C++ CV Libraries, or ImageJ Java CV libraries which implement functions such as object recognition, feature detection, shape and edge detection, segmentation, shape matching, fitting, transformations, rotations, etc, may be used. Similarly statistical and signal processing libraries may be utilised, for example to perform fitting and matching operations. Various database systems and similar data structures may be used to store data regarding the build (eg bricks, 3D models, 6DOF results, etc).

A vision system and method for determining the precise 6DOF position of a brick to be placed by a layhead end effector robot on the end of an articulated telescoping arm has been described. Whilst suited to a construction robot it will be understood that the method and vision system could be used in other applications where it is necessary to know the location of an object but only two faces are visible. The method optionally uses a 3D scan of the brick that is taken prior to conveying the brick to the layhead, and images of two orthogonal faces are taken of the brick after application of adhesive and prior to gripping by the robotic laying arm. Planes are fitted to the orthogonal faces and the 3D scan is used to create a virtual model of the brick which is fitted to the orthogonal faces. This then allows the precise 6DOF location of the brick to be estimated allowing it to be accurately gripped and laid by the robotic laying arm. Alternatively, instead of using a shape model derived from a 3D scan, an ideal CAD model or other user generated model could be used and the model could be a 2D model of one face instead of a 3D representation of the entire object.

Those of skill in the art would understand that information and signals may be represented using any of a variety of technologies and techniques. For example, data, instructions, commands, information, signals, bits, symbols, and chips may be referenced throughout the above description may be represented by voltages, currents, electromagnetic waves, magnetic fields or particles, optical fields or particles, or any combination thereof.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers. As used herein, a phrase referring to "at least one of" a list of items refers to any combination of those items, including single members. As an example, "at least one of: a, b, or c" is intended to cover: a, b, c, a-b, a-c, b-c, and a-b-c.

The reference to any prior art in this specification is not, and should not be taken as, an acknowledgement of any form of suggestion that such prior art forms part of the common general knowledge.

It will be appreciated by those skilled in the art that the disclosure is not restricted in its use to the particular application or applications described. Neither is the present disclosure restricted in its preferred embodiment with regard to the particular elements and/or features described or depicted herein. It will be appreciated that the disclosure is not limited to the embodiment or embodiments disclosed, but is capable of numerous rearrangements, modifications and substitutions without departing from the scope as set forth and defined by the following claims.

The invention claimed is:

1. A method for determining a pose of an object in a local coordinate system of a robotic machine, the method including in one or more electronic processing devices:
   a) capturing, using one or more sensor apparatus, at least one image of a first face of the object and at least one image of at least a portion of a second face of the object, wherein the at least a portion of the second face includes a first edge where the first face meets the second face;
   b) generating a point cloud representation of at least part of the object using image data obtained from the captured images of the first and second faces;

c) fitting a first plane to the first face of the object and fitting a second plane to the second face of the object using the point cloud representation;
d) determining a pose of the first plane and a pose of the second plane using a pose of the one or more sensor apparatus in the local coordinate system;
e) retrieving a shape model of at least the first face of the object comprising dimensions of the at least first face in a scale of the local coordinate system;
f) locating the shape model in the local coordinate system using at least in part the at least one image of the first face; and,
g) determining the pose of the object in the local coordinate system using dimensions of the object, the pose of the first and second plane and the location of the shape model in the local coordinate system, wherein the pose of the object is indicative of a centroid of the object.

2. The method as claimed in claim 1, wherein the method further includes providing the pose of the object to a controller to allow a robot gripper arm of the robotic machine to grip and manipulate the object.

3. The method as claimed in claim 1, wherein the shape model is one of:
a) a 2D representation of the first face of the object; and,
b) a 3D representation of the object, and
wherein, the shape model is derived from at least one of:
i. a computer aided design (CAD) model of the object; and,
ii. performing a scan of the object and generating the shape model from scan data in a virtual coordinate system that preserves each dimension of the object.

4. The method as claimed in claim 1, wherein the one or more sensor apparatus comprises a first sensor apparatus and a second sensor apparatus that capture images using one or more pairs of stereoscopic cameras or a Time of Flight (ToF) imaging sensor that generates a point cloud representation of a field of view of the respective sensor apparatus.

5. The method as claimed in claim 1, wherein the object is held in a fixed location by a gripping apparatus whilst the at least one image of a first face of the object and the at least one image of at least a portion of a second face of the object are captured, and optionally the at least one image of a first face of the object and the at least one image of at least a portion of a second face of the object are captured substantially simultaneously.

6. The method as claimed in claim 1, wherein the one or more sensor apparatus comprise a first sensor apparatus comprising one or more sensors in a first location having a first field of view to view the complete first face of the object when the object is gripped by a gripping apparatus, and a second sensor apparatus comprising one or more sensors in a second location having a second field of view to view at least a portion of the second face of the object when the object is gripped by the gripping apparatus.

7. The method as claimed in claim 6, wherein the first sensor apparatus comprises an array of four sensors each with a field of view that capture a portion of the first face such that the individual fields of view are combined to form the first field of view, and images from each of the array of four sensors is combined to form a first composite image of the first face, and the first plane is fitted to a point cloud representation of the first face using the first composite image.

8. The method as claimed in claim 7, wherein the first sensor apparatus comprises a first pair of sensors located substantially above the object and a second pair of sensors located above the object and having an angular offset to the first pair of sensors, and optionally the first sensor apparatus is less than 600 mm from the object.

9. The method as claimed in claim 6, wherein the second sensor apparatus comprises two sensors each with a field of view that capture a portion of the second face such that the individual fields of view are combined to form the second field of view, and images from each of the two sensors is combined to form a second composite image of a portion of the second face, and the second plane is fitted to a point cloud representation of the second face using the second composite image, and optionally the second sensor apparatus is less than 250 mm from the object.

10. The method as claimed in claim 6, wherein the method includes:
a) capturing images of the first face using the first sensor apparatus;
b) generating a first point cloud representation of the first face using the captured images;
c) fitting a first plane to the first face using the point cloud representation; and,
d) generating a virtual camera orthogonal to the first plane using a pose of the first plane and inverse poses of the first sensor apparatus.

11. The method as claimed in claim 10, wherein the method includes generating a second point cloud representation of the first face by mapping first point cloud data in accordance with the virtual camera, wherein the shape model is a 2D shape model of the first face that is located in the second point cloud representation of the first face.

12. The method as claimed in claim 10, wherein the method includes:
a) transforming the captured images from the first sensor apparatus to project them onto the virtual camera's plane so as to form virtual camera images; and,
b) combining the virtual camera images to generate a composite image,
wherein the shape model is a 2D shape model of the first face that is located in the composite image.

13. The method as claimed in claim 6, wherein the first sensor apparatus captures at least two images of the first face and wherein the method includes locating the shape model in the local coordinate system at least twice using the at least two images of the first face, wherein the method further includes:
a) performing a first shape match to locate the shape model in the local coordinate system using the first image;
b) performing a second shape match to locate the shape model in the local coordinate system using the second image;
c) comparing the difference between the first and second shape match; and,
d) determining whether further images need to be captured using the first sensor apparatus in accordance with results of the comparison,
wherein the difference is compared to a threshold indicative of an alignment between the shape matches.

14. The method as claimed in claim 1, wherein the object is a rectangular object and the second plane is a plane orthogonal to the first plane, and wherein the method further includes offsetting the first plane by half the dimensions of the object along a first axis and offsetting the second plane by half the dimensions of the object along a second axis and intersecting the offset first plane and offset second plane to obtain a line extending through the centre of the object along a third axis.

15. The method as claimed in claim 14, wherein locating the shape model in the local coordinate system defines the location of the object along a third axis orthogonal to both the first and second axes and wherein a third plane is defined through the location of the object along the third axis using the dimensions of the object along the third axis, the third plane being orthogonal to the third axis.

16. The method as claimed in claim 15, wherein the pose of the object in the local coordinate system is determined from:
   a) an intersection between the line extending through the centre of the object along the third axis and the third plane; and,
   b) orientations of the first and second planes.

17. The method as claimed in claim 1, wherein the object is a construction element including a brick, block or tile, wherein a 6DOF pose of the object is determined.

18. A vision system configured to determine the pose in a local coordinate system of an object gripped by a robotic machine including an arm and an end effector at a distal end thereof configured to grip and manipulate the object, the vision system including:
   a) a first sensor apparatus that in use is mounted to the end effector and having a first location and a first field of view to image a first face of the object when gripped by the end effector;
   b) a second sensor apparatus that in use is mounted to the end effector and having a second location and a second field of view to image at least a portion of a second face of the object orthogonal to the first face when gripped by the end effector; and
   c) at least one processor and a memory, the memory comprising instructions to cause the processor to perform a method for determining a pose of an object in a local coordinate system of a robotic machine including:
      i. capturing, using the first sensor apparatus, at least one image of the first face of the object and using the second sensor apparatus, capturing at least one image of at least a portion of the second face of the object, wherein the at least a portion of the second face includes a first edge where the first face meets the second face;
      ii. generating a point cloud representation of at least part of the object using image data obtained from the captured images of the first and second faces;
      iii. fitting a first plane to the first face of the object and fitting a second plane to the second face of the object using the point cloud representation;
      iv. determining a pose of the first plane and a pose of the second plane using a pose of the first and second sensor apparatus in the local coordinate system;
      v. retrieving a shape model of at least the first face of the object comprising dimensions of the at least first face in a scale of the local coordinate system;
      vi. locating the shape model in the local coordinate system using at least in part the at least one image of the first face; and,
      vii. determining the pose of the object in the local coordinate system using dimensions of the object, the pose of the first and second plane and the location of the shape model in the local coordinate system.

19. The vision system according to claim 18, wherein the vision system further includes lighting mounted to the end effector to illuminate the object being imaged, and optionally the first and second sensor apparatus include filters having a wavelength similar to that of the lighting.

20. A robotic machine including:
   a) a base;
   b) an articulated arm extending from the base;
   c) a robotic end effector attached to a distal end of the articulated arm and comprising a first arm, a second arm substantially parallel to the first arm, and a bridging portion to define a Y shaped receiving portion;
   d) a robotic object gripper configured to receive and to grip an object within the Y shaped receiving portion, and
   e) a vision system configured to determine the pose, in a local coordinate system of the robotic machine, of an object gripped by the robotic end effector at a distal end thereof the vision system including:
      a first sensor apparatus mounted to the bridging portion of the robotic end effector and having a first location and a first field of view to image a first face of the object when gripped by the robotic end effector;
      a second sensor apparatus mounted to the robotic end effector and having a second location and a second field of view to image at least a portion of a second face of the object orthogonal to the first face when gripped by the robotic end effector;
      at least one processor and a memory located in the base, the memory comprising instructions to cause the processor to perform a method for determining the pose of an object in the local coordinate system of the robotic machine including:
         i. capturing, using the first sensor apparatus, at least one image of the first face of the object and using the second sensor apparatus, capturing at least one image of at least a portion of the second face of the object, wherein the at least a portion of the second face includes a first edge where the first face meets the second face;
         ii. generating a point cloud representation of at least part of the object using image data obtained from the captured images of the first and second faces;
         iii. fitting a first plane to the first face of the object and fitting a second plane to the second face of the object using the point cloud representation;
         iv. determining a pose of the first plane and a pose of the second plane using a pose of the first and second sensor apparatus in the local coordinate system;
         v. retrieving a shape model of at least the first face of the object comprising dimensions of the at least first face in a scale of the local coordinate system;
         vi. locating the shape model in the local coordinate system using at least in part the at least one image of the first face; and,
         vii. determining the pose of the object in the local coordinate system using dimensions of the object, the pose of the first and second plane and the location of the shape model in the local coordinate system
wherein the second sensor apparatus is mounted in either the first arm or the second arm of the robotic and effector such that the field of view of the second sensor apparatus is substantially orthogonal to the field of view of the first sensor apparatus.

* * * * *